(12) United States Patent
Takano et al.

(10) Patent No.: US 6,360,240 B2
(45) Date of Patent: Mar. 19, 2002

(54) DIGITAL FILTERS

(75) Inventors: Koji Takano, Ogaki; Fumiaki Nagao, Gifu, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/873,626

(22) Filed: Jun. 4, 2001

Related U.S. Application Data

(62) Division of application No. 09/237,520, filed on Jan. 26, 1999.

(30) Foreign Application Priority Data

Jan. 29, 1998 (JP) ............................................. 10-17389
Jan. 29, 1998 (JP) ............................................. 10-17390
Jan. 29, 1998 (JP) ............................................. 10-17391

(51) Int. Cl.$^7$ ................................................ G06F 17/10
(52) U.S. Cl. .......................... 708/319; 708/316; 708/320
(58) Field of Search ................................. 708/300, 303, 708/316, 319, 320

(56) References Cited

U.S. PATENT DOCUMENTS

| 5,319,584 A | * | 6/1994 | Ooyabu .................... 708/303 |
| 5,438,532 A | * | 8/1995 | Nagao et al. ............. 708/319 |
| 5,771,185 A | * | 6/1998 | Miyake et al. ............ 708/603 |
| 5,904,731 A | * | 5/1999 | Matsui ..................... 708/603 |

* cited by examiner

Primary Examiner—Chuong Dinh Ngo
(74) Attorney, Agent, or Firm—Cantor Colburn LLP

(57) ABSTRACT

A digital filter is provided with a plurality of selectors. Switchover from one selector to another switches the digital filter operation between a separation filter function and a synthesis filter function. When the digital filter functions as either separation filter or synthesis filter, it switches over between the functions of multiplying data by a filter coefficient and multiplying data by an attenuation coefficient. The entire digital filter circuit size can thus be reduced.

5 Claims, 16 Drawing Sheets

| Signal | | | | | | | | | | |
|---|---|---|---|---|---|---|---|---|---|---|
| INPUT DATA | X(8) | X(9) | | | | | | | | X(10) |
| RAM WRITE | X(8) | | | | | | | | X(9) | |
| RAM READ | | X(8) | X(6) | X(4) | X(2) | X(7) | X(5) | X(3) | X(1) | |
| ROM READ | | h(0) | h(2) | h(4) | h(6) | h(1) | h(3) | h(5) | h(7) | |
| REGISTER | | | A(1) | A(2) | A(3) | A(4) | B(1) | B(2) | B(3) | B(4) |
| FIRST REGISTER | | | | | | A(4) | | | | |
| SECOND REGISTER | | | | | | | | | | B(4) |
| FIRST OUTPUT REGISTER (OUTPUT DATA) | | | | | | | | | | Yb(4) Ya(4) |

Fig. 6

| INPUT DATA | Xb(4) | | Xa(5) | | Xb(5) | | | |
|---|---|---|---|---|---|---|---|---|
| FIRST REGISTER | | Xa(4) | | | | Xa(5) | | |
| SECOND REGISTER | | | Xb(4) | | | | Xb(5) | |
| RAM WRITE | Xa(4)-Xb(4) | | | | Xa(4)+Xb(4) | | | Xa(5)-Xb(5) |
| RAM READ | | Xa(4)-Xb(4) | Xa(3)-Xb(3) | Xa(2)-Xb(2) | Xa(1)-Xb(1) | Xa(4)-Xb(4) | Xa(3)-Xb(3) | Xa(2)-Xb(2) | Xa(1)-Xb(1) |
| ROM READ | | h(0) | h(2) | h(4) | h(6) | h(1) | h(3) | h(5) | h(7) |
| REGISTER | | | A(1) | A(2) | A(3) | A(4) | B(1) | B(2) | B(3) | B(4) |
| SECOND OUTPUT REGISTER (OUTPUT DATA) | | | Y(7) | | | Y(8) | | | Y(9) |

Fig. 7

DIGITAL FILTERS

CROSS REFERENCE TO RELATED APPLICATIONS

This is a Divisional Application of U.S. application Ser. No. 09/237,520 filed Jan. 26, 1999 entitled DIGITAL FILTERS.

BACKGROUND OF THE INVENTION

1. Field of the Invention

The present invention relates to digital filters that are used for digital audio devices in order to execute digital data separation and/or synthesis.

2. Description of the Related Art

A Finite Impulse Response (FIR) type digital filter is constructed so that output data Y(n) will be produced by convoluting input data X(n) and impulse responses, as expressed by equation (1).

$$Y(n) = \sum_{k=0}^{N-1} h(k) \cdot X(n-k) \tag{1}$$

where, h(k) is a filter coefficient and N is the number of taps. When transformed with regard to Z, the equation (1) will be as follows:

$$H(z) = \sum_{n=0}^{N-1} h(n) \cdot Z^{-n} \tag{2}$$

The equation (2) will be further transformed as follows:

$$H(e^{j\omega}) = \sum_{n=0}^{N-1} h(n) \cdot \theta^{-j\omega n} \tag{3}$$

The equation (3) determines a frequency response. Assuming that $\omega = 2\pi k/N$, the equation (3) will be as follows:

$$H(e^{j\omega}) = \sum_{n=0}^{N-1} h(n) \cdot e^{-j2\pi nk/N} \tag{4}$$

This equation (4) may be regarded as an expression of Discrete Fourier Transformation (DFT). Thus, the filter coefficient h(k) is obtained through Inverse Discrete Fourier Transformation (IDFT) of the frequency characteristic given by the equation 4.

FIG. 1 shows the circuit of a standard FIR type digital filter.

In this filter circuit, a plurality of delay elements 1, which may be, for example, shift registers, are connected in series with each other and each of these elements delays the input data X(n) a certain period T. This circuit also has a plurality of multipliers 2, the first multiplier connected to the input data X(n) carrying line to the first delay element 1 and the remaining connected to the output line from each delay element 1. The first multiplier 2 multiplies the input data X(n) by a given filter coefficient h(k) and the remaining multipliers 2 multiply the output from each delay element 1 by the same filter coefficient h(k). In this way, the input data X(h) is convoluted with the impulse responses.

A total sum adder 3, included in this circuit, sums up the outputs from all the multipliers 2, that is, the input data X(n) and the outputs from all delay elements 1 after being multiplied by the predetermined filter coefficient h(k), and produces output data Y(n). Consequently, the input data X(n) has now been processed, subject to the arithmetic operation in compliance with the above-mentioned equation (1).

Because an array of delay elements 1 and multipliers 2, corresponding to the number of taps N are required, this type of digital filter has a problem that its entire circuit size becomes larger as the number of the taps increases. Therefore, a digital filter using a stored program method has been proposed which stores time-series input data in a memory once and sequentially multiplies the input data by the filter coefficient after reading it from the memory, while accumulating the product of each multiplication.

FIG. 2 shows a block diagram representing the digital filter using the stored program method.

In this block diagram, a RAM 11 sequentially stores time-series input data X(n) that has been input to it from moment to moment. A plurality of filter coefficients h(k) are stored in a ROM 12. Input data X(n) stored in the RAM 11 is read out at its arithmetic step and from the ROM 12 a step-specific filter coefficient h(k) with a value of k incrementing step by step is read out, where k corresponds to the k described in equation (1). Then, a multiplier 13 multiplies the input data X(n–k) read from the RAM 11 by the filter coefficient h(k) read from the ROM 12.

An accumulator 14, consisting of an adder 15 and a register 16, accumulates the product of each multiplication executed by the multiplier 13. Specifically, the adder 15 adds the output from the multiplier 13 and the output from the register 16 and the resultant sum is stored into the register 16 again. In this way, the product of each multiplication executed by the multiplier 13 is heated up sequentially. An output register 17 receives an accumulation value output from the accumulator 14 and outputs it as output data Y(n).

After reading the input data X(n) and the filter coefficient h(k) sequentially from the RAM 11 and ROM 12, respectively, the FIR type digital filter repeats the product sum arithmetic operation and produces the output data Y(n), thus processing the arithmetic of equation (1). This type of a digital filter does not become large, even if the filter circuit includes a large number of taps N.

One digital filter is assumed to have the first filter coefficient h1(n), whereas another digital filter is assumed to have the second filter coefficient h2(n) given by the following equation:

$$h_2(n) = (-1)^n \cdot h_1(n) \tag{5}$$

The latter digital filter is referred to as a mirror filter because of its frequency response characteristics. The arithmetic relation of this filter with Z transformation can be expressed as follows:

$$H_2(z) = \sum_{n=-\infty}^{\infty} Z^{-n} \cdot h_2(n) \tag{6}$$

$$= \sum_{n=-\infty}^{\infty} Z^{-n} \cdot (-1)^{-n} \cdot h_1(n)$$

$$= H_1(-Z)$$

When we consider the frequency response characteristics of the filter, the following equation is obtained:

$$h_2(n) = \theta^{j\pi n} \cdot h_1(n) \tag{7}$$

When equation (7) is assigned to equation (6), the following equation is derived:

$$H_2(\theta^{j\omega}) = H_1(\theta^{j\omega + j\pi}) \tag{8}$$

From equation (8), the frequency response characteristics of the mirror filter are symmetric with regard to π/2. Because π/2 is ¼ of the sampling period, the mirror filter is called a Quadrature Mirror Filter (QMF). A QMF of this kind is detailed in a publication "IEEE Transactions on Acoustics Speech and Signal Processing" (Vol. ASSP-32, No. 3, June, 1984, pp. 522–531).

A separation filter in which the above-mentioned QMF separates the input data into frequency components in different bands is constructed to produce two output data Ya(n) and Yb(n) which have been separated from the input data X(n). This filter convolutes the input data X(n) with the impulse responses and executes adding and subtracting calculations on the data obtained from the convolution process, as expressed by equations (9) and (10).

$$Ya(n) = \sum_{k=N-1}^{0} h(2k) \cdot X(2n-2k) - \sum_{k=N-1}^{0} h(2k+1) \cdot X(2n-2k+1) \quad (9)$$

$$Yb(n) = \sum_{k=N-1}^{0} h(2k) \cdot X(2n-2k) + \sum_{k=N-1}^{0} h(2k+1) \cdot X(2n-2k+1) \quad (10)$$

FIG. 3 shows a block diagram representing the structure of the separation filter in which data separation into different frequency bands is performed according to equations (9) and (10).

As shown in this block diagram, a plurality of delay elements 21 are serially connected and each of these elements delays the input data X(n) a certain period T. Of a plurality of first multipliers 22, one is connected to the input data X(n) carrying line to the first delay element 21 and the remaining multipliers 22 are connected to the output line from each of the delay elements 21 located in the even number stages. The first multipliers 22 multiply the input data X(n) and the outputs from these delay elements 21 by a filter coefficient h(2k). There are also a plurality of second multipliers 23 connected to the output line from each of the delay elements 21 located in the odd number stages. The second multipliers 23 multiply the outputs of these delay elements 21 by a filter coefficient h(2k+1). In this way, the input data X(n) is convoluted with the impulse responses.

A first total sum adder 24 sums up the outputs from all first multipliers 22 and outputs intermediate data An. On the other hand, a second total sum adder 25 sums up the outputs from all second multipliers 23 and outputs intermediate data Bn.

A subtracter 26 subtracts the intermediate data Bn supplied by the second total sum adder 25 from the intermediate data An supplied by the first total sum adder 24, and outputs the first output data Ya(n). An adder 27 adds the intermediate data An supplied by the first total sum adder 24 and the intermediate data Bn supplied by the second total sum adder 25 and outputs the second output data Yb(n). In this way, the filter circuit accomplishes the arithmetic operation in compliance with the equations (9) and (10).

On the other hand, a synthesis filter in which the above-mentioned QMF synthesizes the input data frequency components existing in separate bands is constructed to produce an output data Y(n) into which the input data Xa(n) and Xb(n) are combined. This filter convolutes the values obtained by adding and subtracting calculations on the first and the second input data Xa(n) and Xb(n) with the impulse responses, as expressed by equations (11) and (12).

$$Y(2n) = \sum_{k=0}^{N-1} h(2k)\{Xa(n-k) - Xb(n-k)\} \quad (11)$$

$$Y(2n+1) = \sum_{k=0}^{N-1} h(2k+1)\{Xa(n-k) - Xb(n-k)\} \quad (12)$$

FIG. 4 shows a block diagram representing the structure of the synthesis filter in which the synthesis of separate frequency bands is performed in accordance with the equations (11) and (12).

As shown in this block diagram, a subtracter 31 subtracts the second input data Xb(n) from the first input data Xa(n) and an adder 32 adds the first and the second input data Xa(n) and Xb(n). A changeover switch 33 alternately switches the output between the output from the subtracter 31 and the output from the adder 32.

A plurality of delay elements 34 are serially connected and each of these elements delays the output from the subtracter 31 or the output from the adder 32 a certain period T. Of a plurality of first multipliers 35, one multiplier 35 is connected to the output line from the switch 33 and the remaining are connected to the output line from each of the delay elements 34 located in the even number stages. The first multipliers 35 multiply the switch 33 output and the outputs from these delay elements 35 by a filter coefficient h(2k). Also included are a plurality of second multipliers 36 connected to the output line from each of the delay elements 34 located in the odd number stages. The second multipliers 36 multiply the outputs of these delay elements 34 by a filter coefficient h(2k+1). The main filter circuit section described above allows the values obtained by adding and subtracting calculations on the first and the second input data Xa(n) and Xb(n) to be convoluted with the impulse responses.

A first total sum adder 37 sums up the outputs from all first multipliers 35 and outputs intermediate data An. On the other hand, a second total sum adder 38 sums up the outputs from all second multipliers 36 and outputs intermediate data Bn. A changeover switch 39 alternately switches between the intermediate data An and the intermediate data Bn in synchronization with the changeover switch 33 and outputs the output data Y(n). In this way, the filter circuit accomplishes the arithmetic operation in compliance with equations (11) and (12).

The Applicant previously proposed constructing the separation and synthesis filters described above by using the above-mentioned stored program method. The details of this proposal are disclosed in Japanese Patent Laid-Open Publications No. Hei 6-216715 and No. Hei 7-131295.

For audio devices such as mini-disc (MD) players, data separation is executed when recording sound in order to separate audio data consisting of mixed different frequency components into data components in their specific frequency bands. Also, data synthesis is executed when reproducing sound in order to return a plurality of data to read which have been recorded in their specific frequency bands to the original form of the audio data. Therefore, such device is designed to operate as follows. In sound recording mode, using a separation filter as shown in FIG. 3, the device separates the audio data into data components in their specific frequency bands and compresses each separated data before recording the data into a recording medium. In sound reproducing mode, using a synthesis filter as shown in FIG. 4, the device synthesizes a plurality of data to read which has been expanded after read from the recording medium and produces the output.

Such a device enabling both sound recording and reproduction is required to have both separation and synthesis filters, which creates a problem that circuit size is made larger. Even if the QMF based on the above-mentioned stored program method is used, two sets of multipliers and accumulators are required and it is difficult to reduce the overall circuit size.

Moreover, a general audio device is provided with an attenuation function for decreasing the reproduced sound volume by attenuating audio signals. For a digital audio device which is typically a mini-disc (MD) player, the attenuation function is implemented by multiplying the digitized audio data by an attenuation coefficient in order that the gain be 1 or less.

In a digital data arithmetic processing circuit, the increase in the number of multipliers, which are relatively large circuit components, makes the arithmetic units complex, thus resulting in the increase of the cost. Particularly, when processing the audio data consisting of a large number of bits, the increase of multipliers is liable to have a significant effect on the increase of the cost.

SUMMARY OF THE INVENTION

An object of the present invention is to provide a digital filter that is capable of executing data separation and synthesis.

Moreover, another object of the present invention is to corporate an attenuation function into the digital filter without increasing the entire circuit size.

The digital filter according to the present invention, when its first selector selects the sum of accumulation executed by an accumulator and its second selector selects time-series input data, executes multiplication and accumulation processing on the time-series input data and then executes adding and subtracting calculations on the prior arithmetic result. When the first selector selects time-series input data and the second selector selects the result of arithmetic executed by an adder-subtracter, the digital filter executes adding and subtracting calculations on a plurality of time-series input data and then executes multiplication and accumulation processing on the prior arithmetic result. A separation filter is implemented by carrying out adding and subtracting calculations after multiplication and accumulation. A synthesis filter is implemented by carrying out multiplication and accumulation after adding and subtracting calculations.

Moreover, in the present invention, the time-series input data is multiplied by a given attenuation coefficient and stored into a RAM. Then, the attenuated time-series input data is multiplied by a filter coefficient and subjected to the arithmetic processing for data separation into frequency bands. A common multiplier is used for both the multiplication by an attenuation coefficient and the multiplication by an filter coefficient, and therefore no additional multipliers are required.

Moreover, according to the present invention, the result of arithmetic executed by the accumulator, that is, the resultant data from the input data, is input to the multiplier again, and output after multiplied by a given attenuation coefficient. The use of the common multiplier for multiplying the input data by a filter coefficient and an attenuation coefficient allows the filter to comprise the attenuation function without increasing the number of multipliers.

BRIEF DESCRIPTION OF THE DRAWINGS

FIG. 6 is an internal data flow timing chart, intended to explain the data separating operation executed by the digital filter of the first embodiment.

FIG. 7 is an internal data flow timing chart, intended to explain the data synthesizing operation executed by the digital filter of the first embodiment.

DESCRIPTION OF PREFERRED EMBODIMENTS

[First Embodiment]

Figure 1:
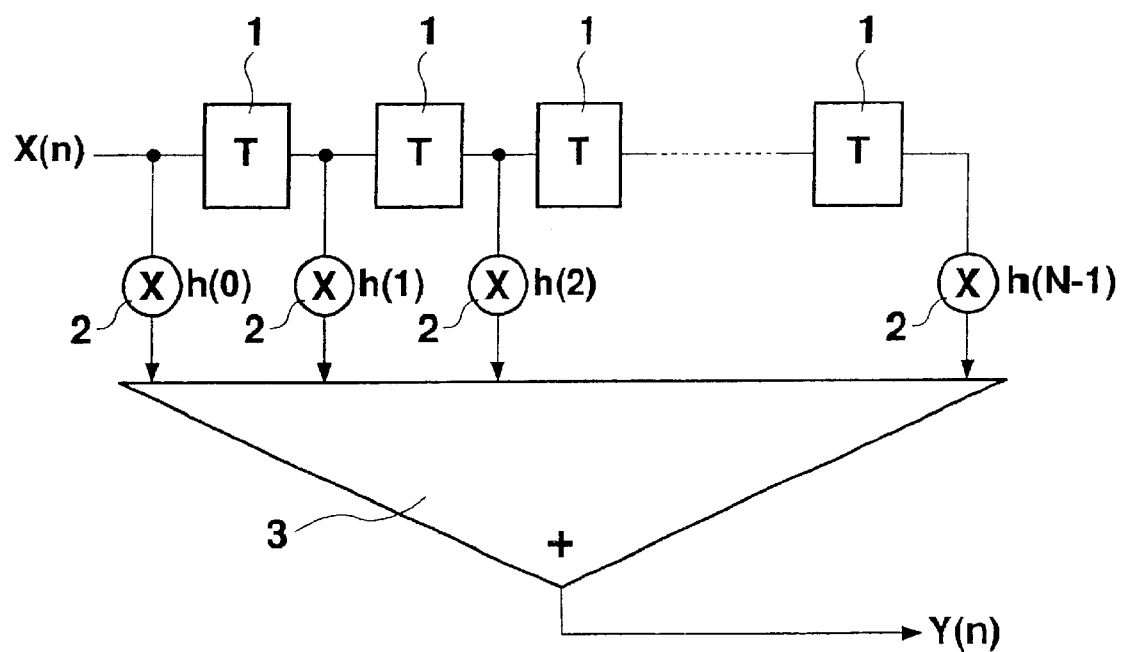
FIG. 1 is a circuit diagram showing the structure of a predecessor FIR digital filter.
Figure 2:
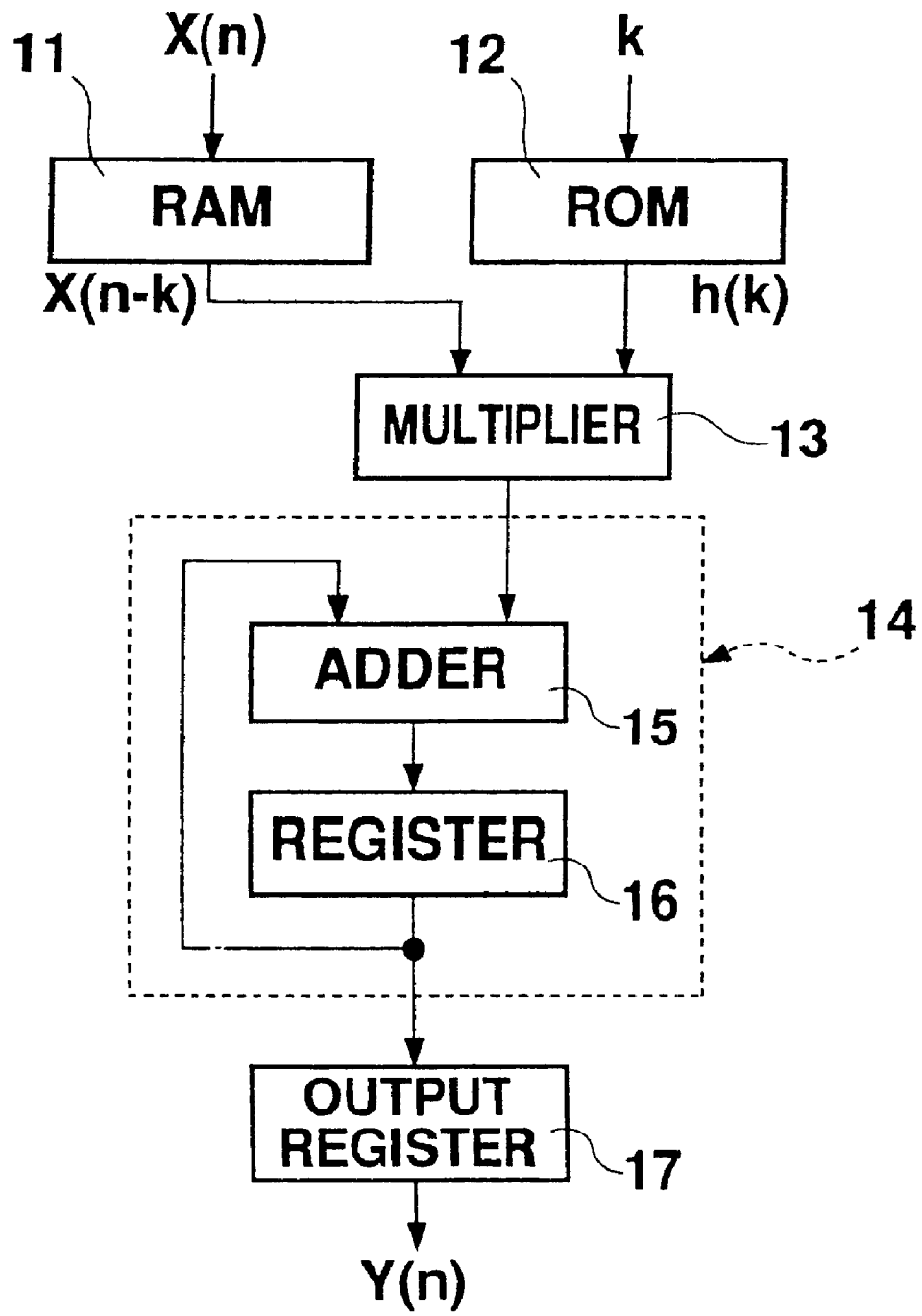
FIG. 2 is a block diagram showing the structure of a predecessor digital filter based on the stored program method.
Figure 3:
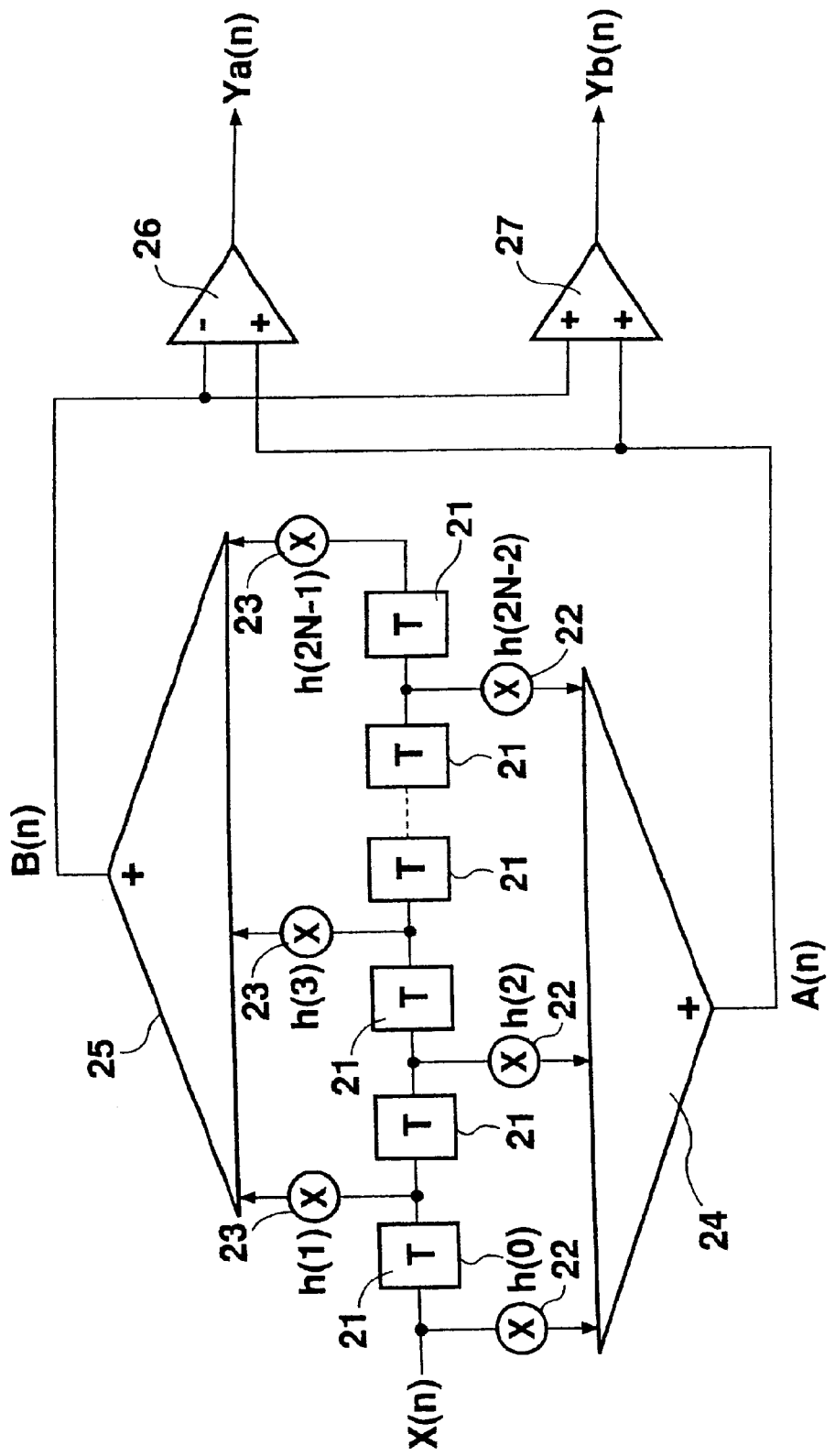
FIG. 3 is a circuit diagram showing the structure of a separation filter using a predecessor QMF.
Figure 4:
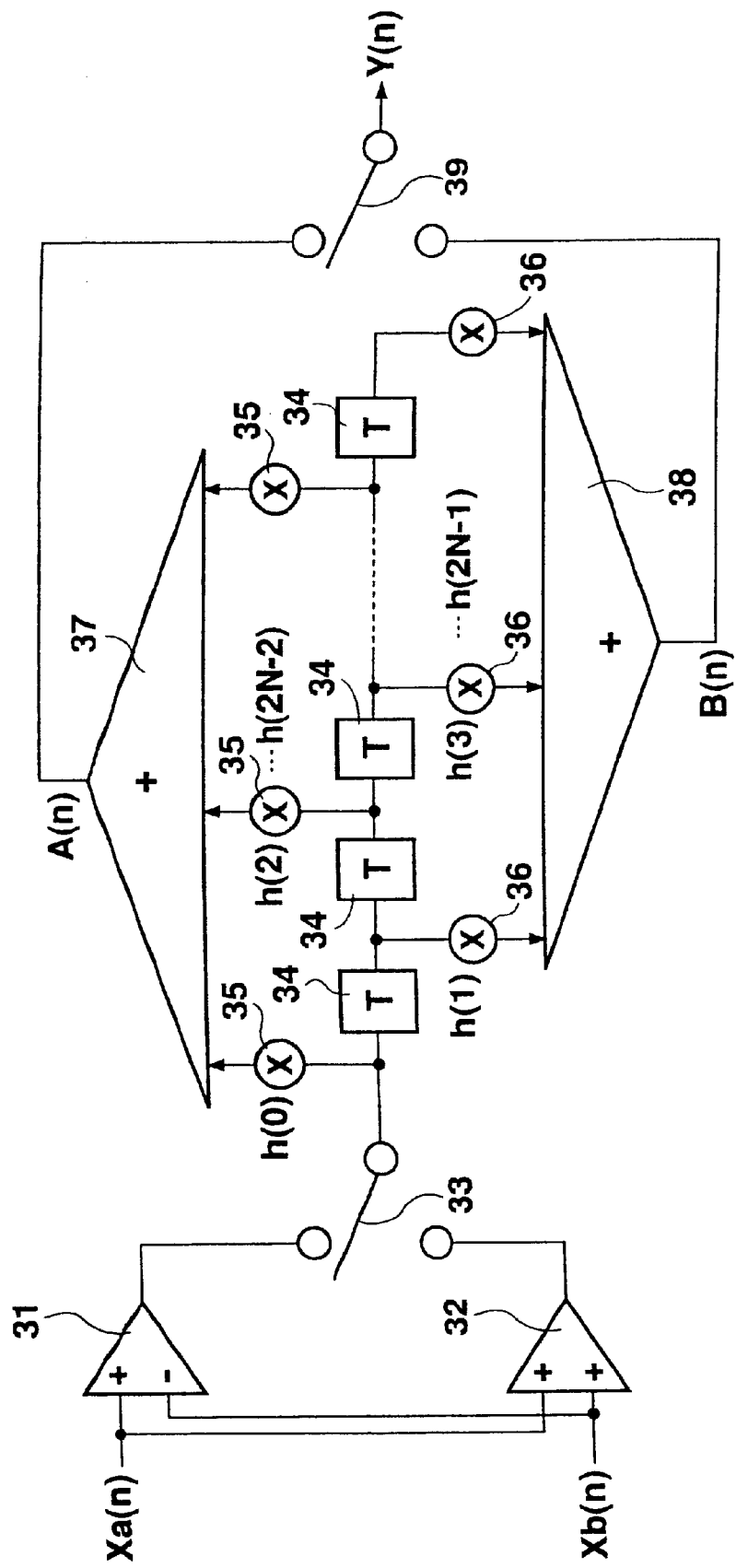
FIG. 4 is a circuit diagram showing the structure of a synthesis filter using a predecessor QMF.
Figure 5:
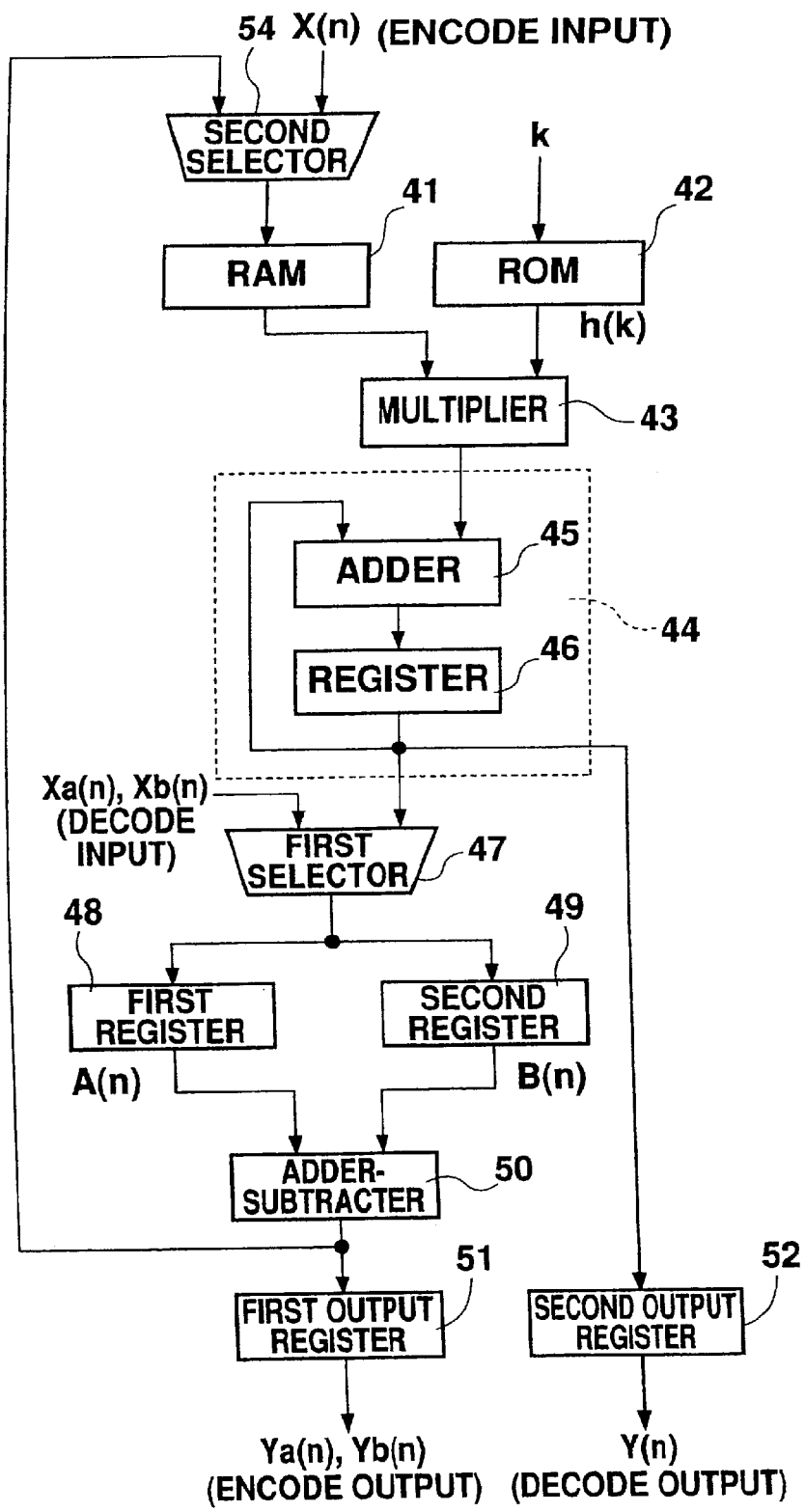
FIG. 5 is a block diagram showing a digital filter configured as in a first embodiment of the present invention.

FIG. 5 is a block diagram showing a digital filter configured according to a first embodiment of the present invention.

RAM 41, connected to a second selector 54 which will be described below, stores time-series data which has been input to it from the second selector 54 for a predetermined period. Each data stored in the RAM 41 is sequentially read out for the arithmetic processing step. From a ROM 42, in which a plurality of filter coefficients h(k) have previously been stored, a step-specific filter coefficient h(k) with a value of k incrementing step by step is read out repeatedly, where k corresponds to the k given in the above-mentioned equations (9) through (12). A multiplier 43, connected to the RAM 41 and the ROM 42, multiplies the data read from the RAM 41 by the filter coefficient h(k) read from the ROM 42. An accumulator 44 consisting of an adder 45 and a register 46 is connected to the multiplier 43. The accumulator 44 accumulates the product of each multiplication executed by the multiplier 43 in accordance with the number of taps. To be exact, the adder 45 adds the data read from the register 46 and the multiplication product data supplied from the multiplier 43 and the resultant sum is stored into the register 46 again. In this way, the product of each multiplication executed by the multiplier 43 is accumulated.

A first selector 47, connected to the accumulator 44 and the decode input, selects and outputs either (i) the accumulation data supplied from the accumulator 44 or (ii) time-series input data Xa(n) and Xb(n). From the decode input, one of the two input data Xa(n) and Xb(n) is alternately input to the first selector 47 on a time-sharing basis. A first register 48 and a second register 49 are connected to the first selector 47. These registers 48 and 49 alternately receive and store the data which is continuously supplied from the first selector 47, so that either (i) the accumulation data or (ii) the input data Xa(n) and Xb(n) will be written into one of the registers. Then, the registers 48 and 49 output the stored data at a given timing, respectively. For example, these registers are designed such that data A(n) which is output from the first selector 47 at the first and at following odd number inputs will be stored into the first register 48 and data B(n) which is output from the first selector 47 at the second and following even steps will be stored into the second register 49. An adder-subtracter 50, connected to the first register 48 and the second register 49, executes subtracting or adding calculation on the data A(n) and B(n) read from the registers 48 and 49. A second selector 54, connected to the adder-subtracter 50 and the encode input, selects and outputs either the adding/subtracting calculation data supplied from the adder-subtracter 50 or time-series input data X(n) supplied from the encode input.

A first output register 51, connected to the adder-subtracter 50, stores the adding/subtracting calculation data which has been supplied from the adder-subtracter 50 whenever the adder-subtracter completes arithmetic processing, and outputs data Ya(n) and Yb(n). In response to the adder-subtracter 50 that repeats alternately addition and subtraction, for example, the register 51 outputs the subtracting calculation data as output data Ya(n) and the adding calculation data as output data Yb(n). The output from the first output register 51 becomes an encode output. A second output register 52, connected to the accumulator 44, stores the accumulation data which has been supplied from the accumulator 44 whenever the accumulator completes required arithmetic processing, and outputs data Y(n). The output from the second output register 52 becomes a decode output.

The digital filter, whose components are outlined above, acts as a separation filter when the first selector 47 selects the accumulation data from the accumulator 44 and the second selector 54 selects input data X(n). The digital filter operating in this mode produces data Ya(n) and Yb(n) from the input data X(n) and outputs data Ya(n) and Yb(n) through the first output register 51. That is, the digital filter executes encoding. When the first selector 47 selects input data Xa(n) and Xb(n) and the second selector 54 selects the adding/subtracting calculation data supplied from the adder-subtracter 50, the digital filter acts as a synthesis filter and outputs data Y(n) produced from the input data Xa(n) and Xb(n) through the second output register 52. That is, the digital filter executes decoding.

FIG. 6 shows an example internal data flow timing chart, in order to explain the separation filter operation of the digital filter configured as shown in FIG. 5, on the assumption that the number of taps N is "4," that is, n=4. In the separation filter mode, the first selector 47 selects the accumulation data from the accumulator 44 and the second selector 54 selects input data X(n).

If equations (9) and (10) are recalculated assuming the number of taps N=4, the calculation of equation (9) will be as follows:

$$Ya(n)=h(6)\cdot X(2n-6)+h(4)\cdot X(2n-4)+h(2)\cdot X(2n-2)+h(0)\cdot X(2n)-$$
$$h(7)\cdot X(2n-7)-h(5)\cdot X(2n-5)-h(3)\cdot X(2n-3)-h(1)\cdot X(2n-1) \quad (13)$$

The calculation of equation (10) will be as follows:

$$Yb(n)=h(6)\cdot X(2n-6)+h(4)\cdot X(2n-4)+h(2)\cdot X(2n-2)+h(0)\cdot X(2n)+$$
$$h(7)\cdot X(2n-7)+h(5)\cdot X(25)+h(3)\cdot X(2n-3)+h(1)\cdot X(2n-1) \quad (14)$$

Input data X(8) shown in FIG. 6 is written into the RAM 41 via the second selector 54. Although FIG. 6 omits the writing of input data X(0) to X(7), it is assumed that the data X(0) to X(7) have been input prior to the input data X(8) and stored into the RAM 41.

When the input data X(8) is first read from the RAM 41 and its corresponding filter coefficient h(0) is read from the ROM 42, the multiplier 43 multiplies X(8) by h(0) and the multiplication product data is supplied to the accumulator 44. At this time, no data exists in the accumulator 44. Thus, the following value obtained by multiplying the input data X(8) by the filter coefficient h(0) is stored as is into the register 46:

$$A1=h(0)\cdot X(8)$$

Then, the input data X(6), X(4), and X(2) and their corresponding filter coefficients h(2), h(4), and h(6) are sequentially read from the RAM 41 and the ROM 42, respectively. The multiplier 43 multiplies X(6) by h(2), X(4) by h(4), and X(2) by h(6) and sequentially supplies each multiplication product data to the accumulator 44. Each multiplication product input is accumulated in the accumulator 44 and the following are sequentially stored into the register 46:

$$A2=h(2)\cdot X(6)+A1$$

$$A3=h(4)\cdot X(4)+A2$$

$$A4=h(6)\cdot X(2)+A3$$

Eventually, the following data is stored into the register 46:

$$A4=h(0)\cdot X(8)+h(2)\cdot X(6)+h(4)\cdot X(4)+h(6)\cdot X(2)$$

This data is stored into the first register 48 via the first selector 47.

Next, when input data X(7) is read from the RAM 41 and its corresponding filter coefficient h(1) is read from the ROM 42, the multiplier 43 multiplies X(7) by h(1) and the multiplication product data is supplied to the accumulator 44. At this time, the register 46 of the accumulator 44 has been cleared to zero. Thus, the following value obtained by multiplying the input data X(7) by the filter coefficient h(1) is stored as is into the register 46:

$$B1=h(1)\cdot X(7)$$

Then, the input data X(5), X(3), and X(1) and their corresponding filter coefficients h(3), h(5), and h(7) are sequentially read from the RAM 41 and the ROM 42 respectively. Each product obtained by multiplying X(5) by h(3), X(3) by h(5), and X(1) by h(7) is sequentially supplied to the accumulator 44. Thus, the following are sequentially stored into the register 46:

$$B2=h(3)\cdot X(5)+B1$$

$$B3=h(5)\cdot X(3)+B2$$

$$B4=h(7)\cdot X(1)+B3$$

Eventually, the following data is stored into the register 46:

$$B4=h(1)\cdot X(7)+h(3)\cdot X(5)+h(5)\cdot X(3)+h(7)\cdot X(1)$$

This data is stored into the second register 49 via the first selector 47.

From the first register 48 and the second register 49, respectively, the data A4 and B4 are input to the adder-subtracter 50 where A4 and B4 are added and B4 is subtracted from A4. After processed through the adder-subtracter 50, the adding calculation data:

$$A4+B4=h(6){\cdot}X(2)+h(4){\cdot}X(4)+h(2){\cdot}X(6)+h(0){\cdot}X(8)+h(7){\cdot}X(1)+\\h(5){\cdot}X(3)+h(3){\cdot}X(5)+h(1){\cdot}X(7)$$

is stored into the first output register 51 as output data Yb(4). Also, the subtracting calculation data:

$$A4-B4=h(6){\cdot}X(2)+h(4){\cdot}X(4)+h(2){\cdot}X(6)+h(0){\cdot}X(8)-h(7){\cdot}X(1)-\\h(5){\cdot}X(3)-h(3){\cdot}X(5)-h(1){\cdot}X(7)$$

is stored into the first output register 51 as output data Ya(4). As a result, the arithmetic operations expressed by the above-mentioned equations (13) and (14) have now been accomplished.

FIG. 7 shows an example internal data flow timing chart, in order to explain the synthesis filter operation of the digital filter configured as shown in FIG. 5, on the assumption that the number of taps N is "4," that is, n=4. In the synthesis filter mode, the first selector 47 selects the input data Xa(n) and Xb(n) and the second selector 54 selects the adding/subtracting calculation data from the adder-subtracter 50.

If equations (11) and (12) are recalculated assuming the number of taps N=4. The calculation for equation (11) will be as follows:

$$Y(2n)=h(0){\cdot}\{Xa(n)-Xb(n)\}+h(2){\cdot}\{Xa(n-1)-Xb(n-1)\}+h(4){\cdot}\{Xa(n-2)-Xb(n-2)\}+h(6){\cdot}\{Xa(n-3)-Xb(n-3)\} \quad (15)$$

The calculation for equation (12) will be as follows:

$$Y(2n+1)=h(1){\cdot}\{Xa(n)-Xb(n)\}+h(3){\cdot}\{Xa(n-1)-Xb(n-1)\}+\\h(5){\cdot}\{Xa(n-2)-Xb(n-2)\}+h(7){\cdot}\{Xa(n-3)-Xb(n-3)\} \quad (16)$$

Input data Xa(4) and Xb(4), which are alternately input to the digital filter on a time-sharing basis, are stored into the first register 48 and the second register 49, respectively, via the first selector 47. The adder-subtracter 50 subtracts the input data Xb(4) stored into the second register 49 from the input data Xa(4) stored into the first register 48. The subtracting calculation data {Xa(4)–Xb(4)} is written into the RAM 41 via the second selector 54. Although FIG. 7 omits the subtraction processing for input data Xa(1) to Xa(3) and Xb(1) to Xb(3), subtraction is executed in the same manner as for the input data Xa(4) and Xb(4). After the input data Xa(1) to Xa(3) and Xb(1) to Xb(3) are stored into the first register 48 and the second register 49 respectively, the adder-subtracter 50 subtracts xb(1) from Xa(1), Xb(2) from Xa(2), and Xb(3) from Xa(3). Then, it is assumed that the subtracting calculation data {Xa(1)–Xb(1)}, {Xa(2)–Xb(2)}, and {Xa(3)–Xb(3)} have also been stored into the RAM 41.

When the subtracting calculation data {Xa(4)–Xb(4)} is first read from the RAM 41 and its corresponding filter coefficient h(0) is read from the ROM 42, the multiplier 43 multiplies the data {Xa(4)–Xb(4)} by the filter coefficient h(0) and the multiplication product data is supplied to the accumulator 44. At this time, the register 46 of the accumulator 44 has been cleared to zero. Thus, the following value, that is, the product of the above multiplication, is stored as is into the register 46:

$$A1=h(0){\cdot}\{Xa(4)-Xb(4)\}$$

Then, the subtracting calculation data {Xa(3)–Xb(3)}, {Xa(2)–Xb(2)}, and {Xa(1)–Xb(1)} and their corresponding filter coefficients h(2), h(4), and h(6) are sequentially read from the RAM 41 and the ROM 42 respectively. The multiplier 43 multiplies {Xa(3)–Xb(3)} by h(2), {Xa(2)–Xb(2)} by h(4), {Xa(1)–Xb(1)} by h(6) and sequentially supplies each multiplication product data to the accumulator 44. Each multiplication product input is accumulated in the accumulator 44 and the following are sequentially stored into the register 46:

$$A2=h(2){\cdot}\{Xa(3)-Xb(3)\}+A1$$

$$A3=h(4){\cdot}\{Xa(2)-Xb(2)\}+A2$$

$$A4=h(6){\cdot}\{Xa(1)-Xb(1)\}+A3$$

Eventually, the following data is stored into the register 46:

$$A4=h(0){\cdot}\{Xa(4)-Xb(4)\}+h(2){\cdot}\{Xa(3)-Xb(3)\}+h(4){\cdot}\{Xa(2)-Xb(2)\}+\\h(6){\cdot}\{Xa(1)-Xb(1)\}$$

This data is stored into the second output register 52 as output data Y(8).

Next, the adder-subtracter 50 adds the input data Xa(4) stored into the first register 48 and the input data Xb(4) stored into the second register 49 and the adding calculation data {Xa(4)+Xb(4)} is written into the RAM 41 via the second selector 54. Although FIG. 7 omits the addition processing for input data Xa(1) to Xa(3) and Xb(1) to Xb(3), addition is executed in the same manner as done for the input data Xa(4) and Xb(4). After the input data Xa(1) to Xa(3) and Xb(1) to Xb(3) are stored into the first register 48 and the second register 49 respectively, the adder-subtracter 50 adds Xa(1) and Xb(1), Xa(2) and Xb(2), and Xa(3) and Xb(3). Then, it is assumed that the adding calculation data {Xa(1)+Xb(1)}, {Xa(2)+Xb(2)}, and {Xa(3)+Xb(3)} have also been stored into the RAM 41.

When the adding calculation data {Xa(4)+Xb(4)} is read from the RAM 41 and its corresponding filter coefficient h(1) is read from the ROM 42, the multiplier 43 multiplies the data {Xa(4)+Xb(4)} by the filter coefficient h(1) and the multiplication product data is supplied to the accumulator 44. At this time, no data exists in the accumulator 44. Thus, the following data, that is, the product of the above multiplication, is stored as is into the register 46:

$$B1=h(1){\cdot}\{Xa(4)+Xb(4)\}$$

Then, the adding calculation data {Xa(3)+Xb(3)}, {Xa(2)+Xb(2)}, and {Xa(1)+Xb(1)} and the filter coefficients h(3), h(5), and h(7) are sequentially read from the RAM 41 and the ROM 42 respectively. Each product obtained by multiplying {Xa(3)+Xb(3)} by h(3), {Xa(2)+Xb(2)} by h(5), {Xa(1) +Xb(1)} by h(7) is sequentially supplied to the accumulator 44. Thus, the following are sequentially stored into the register 46:

$$B2=h(3){\cdot}\{Xa(3)+Xb(3)\}+B1$$

$$B3=h(5){\cdot}\{Xa(2)+Xb(2)\}+B2$$

$$B4=h(7){\cdot}\{Xa(1)+Xb(1)\}+B3$$

Eventually, the following data is stored into the register 46:

$$B4=h(1){\cdot}\{Xa(4)+Xb(4)\}+h(3){\cdot}\{Xa(3)+Xb(3)\}+h(5){\cdot}\{Xa(2)+Xb(2)\}+\\h(7){\cdot}\{Xa(1)+Xb(1)\}$$

This data is stored into the second output register 52 as output data Y(9). As a result, the arithmetic operations expressed by the above-mentioned equations (15) and (16) have now been accomplished.

[Second Embodiment]

Figure 8:
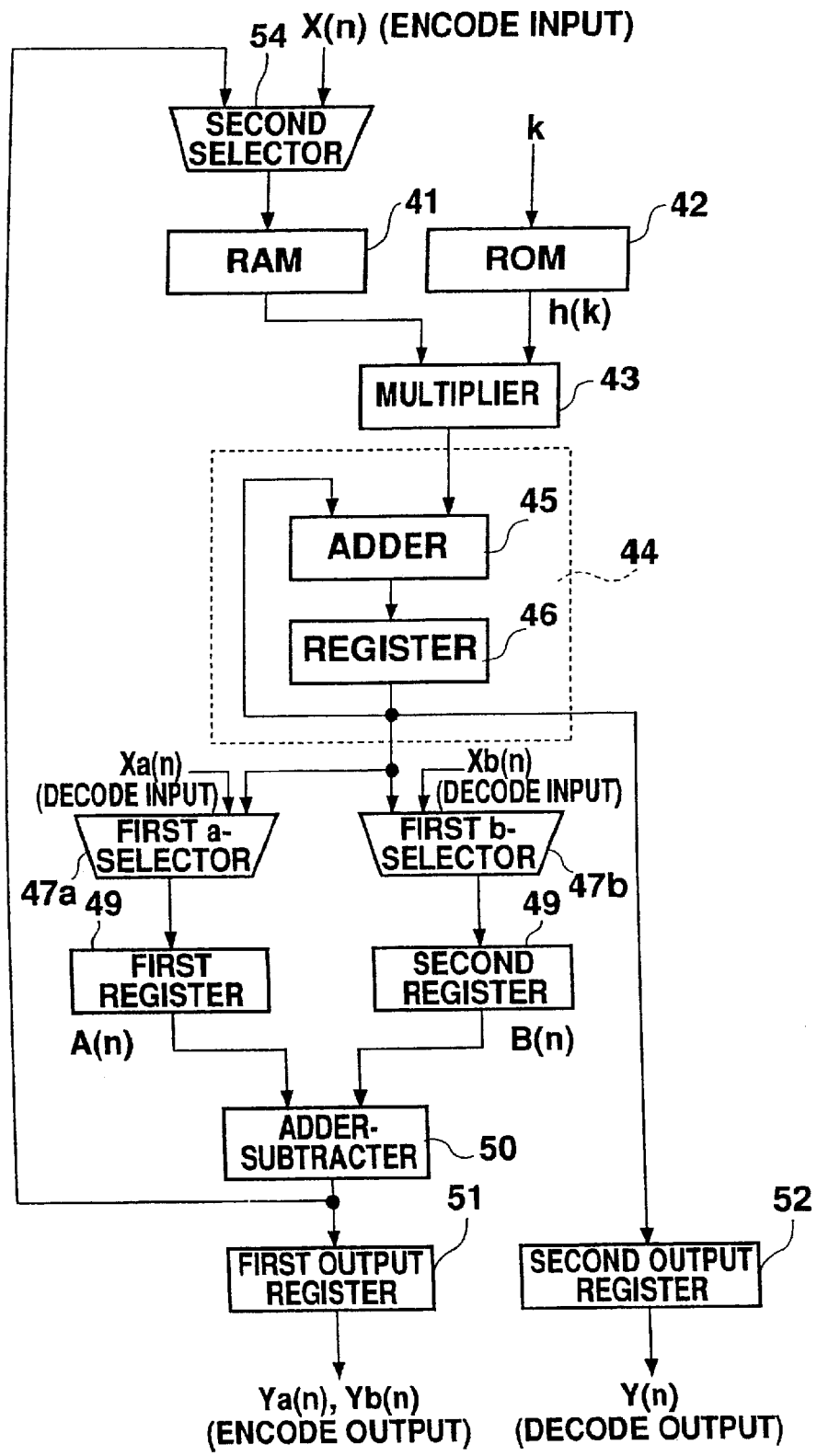
FIG. 8 is a block diagram showing a digital filter configured as in a second embodiment of the present invention.

FIG. 8 is a block diagram showing a digital filter configured in accordance with a second embodiment of the present invention.

A digital filter according to the second embodiment allows the parallel input of data Xa(n) and Xb(n) when operating as the synthesis filter. In the second embodiment, a pair of selectors 47a and 47b arranged in parallel replace the first selector 47 of the digital filter shown in FIG. 5. These selectors are designed to operate as follows. One selector 47a selects either the accumulation data supplied from the accumulator 44 or the input data Xa(n) and supplies the selected data to the first register 48. The other selector 47b selects the accumulation data supplied from the accumulator 44 or the input data Xb(n) and supplies the selected data to the second register 49. With the exception of a pair of the registers 47a and 47b, the structure and operation of the digital filter in the second embodiment corresponds to that in the first embodiment shown in FIG. 5. Therefore, their explanation is not repeated.

In the digital filter configured as shown in FIG. 8, even if the concurrent inputs of two data Xa(n) and Xb(n) occur, the first register 48 can receive the input data Xa(n), while the second register 49 can receive the input data Xb(n) at the same time.

As illustrated by the above embodiments of the present invention, a digital filter can be constructed mainly with a multiplier, an accumulator, and an adder-subtracter that are commonly used for its separation and synthesis filter functions, using a QMF based on the stored program method, beneficial for reducing its overall circuit size. Thus, further reduction of the entire filter circuit size can be expected.

[Third Embodiment]

Figure 9:
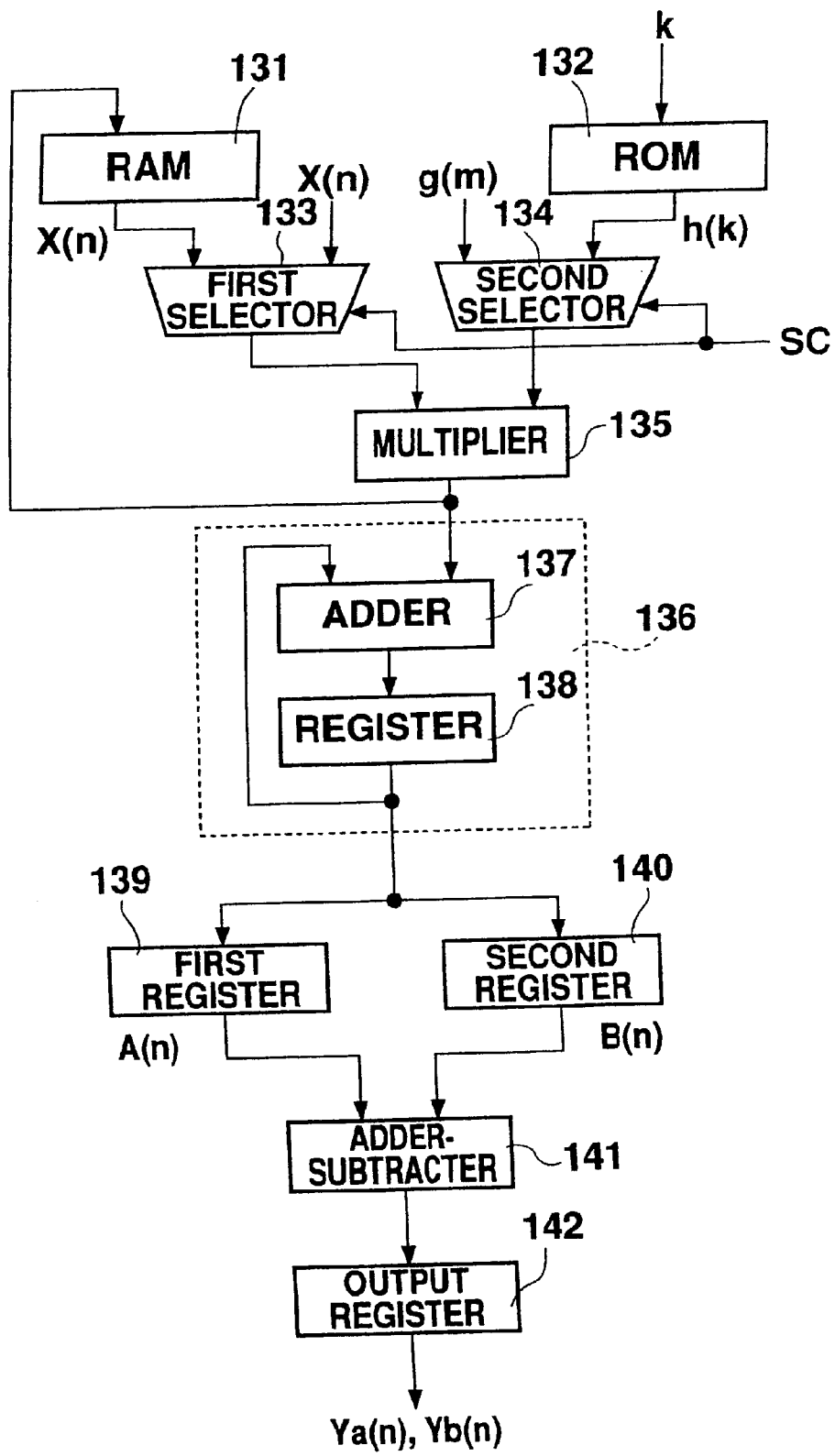
FIG. 9 is a block diagram showing a digital filter configured as in a third embodiment of the present invention.

FIG. 9 is a block diagram showing a digital filter configured in accordance with a third embodiment of the present invention.

A RAM 131, connected to a multiplier 135 which is explained below, stores for a given period the attenuated input data x(n) which has been input to it from the multiplier 135. Each data stored in the RAM 131 is sequentially read and output to the multiplier 135 when subjected to a further arithmetic processing step. From a ROM 132, in which a plurality of filter coefficients h(k) have previously been stored, a step-specific filter coefficient h(k) with a value of k incrementing step by step is read out repeatedly, where k corresponds to the k given in the above-mentioned equations (9) and (10). A first selector 133, connected to the encode input and the RAM 131, selects and outputs either time-series input data X(n) or the attenuated input data x(n) read from the RAM 131. A second selector 134, connected to the attenuation input and the ROM 32, selects and outputs either an attenuation coefficient g(m) or a filter coefficient h(k) read from the ROM 132. These first and second selectors 133 and 134 are placed under selective control in response to a common selective control signal SC.

A multiplier 135, connected to the first and the second selectors 133 and 134, multiplies either the input data X(n) or the attenuated input data x(n) which has been selected by the first selector 133 by either an attenuation coefficient g(m) or a filter coefficient h(k) which has been selected by the second selector 134. The selectors 133 and 134 are designed to operate as follows. When the first selector 133 selects the input data X(n), the second selector 134 selects an attenuation coefficient g(m). When the first selector 133 selects the attenuated input data x(n), the second selector 134 selects a filter coefficient h(k). The multiplier 135 thus executes either the multiplication of the input data X(n) by an attenuation coefficient g(m) or the multiplication of the attenuated input data x(n) by a filter coefficient h(k). The data produced by multiplying the input data X(n) by an attenuation coefficient g(m) is supplied to the RAM 131 and the data produced by multiplying the attenuated input data x(n) by a filter coefficient h(k) is supplied to an accumulator 136.

The accumulator 136 consisting of an adder 137 and a register 138 is connected to the multiplier 135. The accumulator 136 accumulates each multiplication product data which has been input to it from the multiplier 135 in accordance with the number of taps. To be exact, the adder 137 adds the data read from the register 138 and the multiplication product data supplied from the multiplier 135 and the resultant sum is stored into the register 138 again. In this way, the multiplication product data on each multiplication executed by the multiplier 135 is accumulated.

A first register 139 and a second register 140 are connected to the accumulator 136. These registers 139 and 140 alternately receive and store the accumulation data which is continuously supplied from the accumulator 136 and output the stored data at a given timing, respectively. For example, these registers are designed so that intermediate data A(n) which is output from the accumulator 136 at the first and other odd number steps will be stored into the first register 139 and intermediate data B(n) which is output from the accumulator 136 at the second and other even number steps will be stored into the second register 140. An adder-subtracter 141, connected to the first register 139 and the second register 140, executes subtracting or adding calculation on the intermediate data A(n) and B(n) read from the registers 139 and 140.

An output register 142, connected to the adder-subtracter 141, stores the adding/subtracting calculation data input to it from the adder-subtracter 141 whenever arithmetic processing is completed by the adder-subtracter 141, and outputs data Ya(n) and Yb(n). In response to the adder-subtracter 141 that repeats alternately addition and subtraction, for example, the output register 142 outputs the subtracting calculation data as the output data Ya(n) and the adding calculation data as the output data Yb(n) The output from this output register 142 becomes an encode output.

In the digital filter outlined above, the multiplier 135 multiplies the data by an attenuation coefficient g(m) and a filter coefficient h(k) on a time-sharing basis. The digital filter thus generates output data Ya(n) and Yb(n) from the input data X(n) through the processes of attenuation and separation of the input data. This digital filter enables the input data attenuation without using an additional multiplier.

Figure 10:
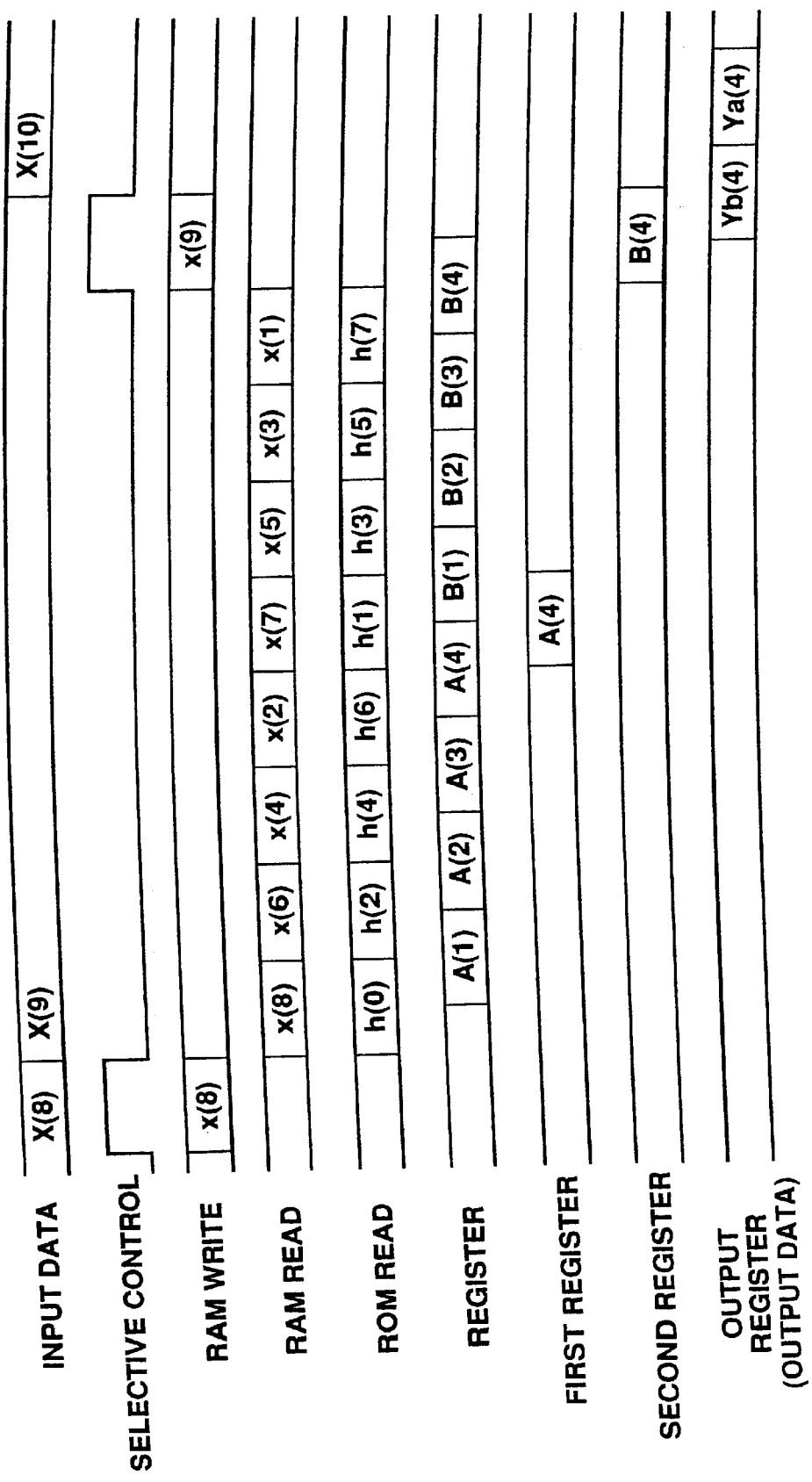
FIG. 10 is an internal data flow timing chart, intended to explain the operation of the digital filter of the third embodiment.

FIG. 10 shows an example internal data flow timing chart in order to explain the operation of the digital filter configured as shown in FIG. 9, on the assumption that the number of taps N is "4," that is, n=4.

Initially, the first selector 133 selects input data X(n) and the second selector 134 selects an attenuation coefficient g(m). In this state, when data X(8) is input, the multiplier 135 multiplies the input data X(8) by an attenuation coefficient g(1) which determines the degree of attenuation of the input data X(n) and is normally fixed to a given value. Then, the multiplication product data x(8) (=X(8)·g(1)) is written into the RAM 131 as attenuated input data. Upon the completion of writing the attenuated input data x(8) into the RAM 31, the first selector 133 changes to receiving the attenuated input data x(8) (the input from the RAM 131) and the second selector 134 also changes to receiving a filter coefficient h(k) (the input from the ROM 132).

The digital filter executes data separation of the attenuated input data x(8) stored into the RAM 31. This data separation process is the same as explained with reference to FIG. 6, except that the input data X(n) is replaced by the attenuated input data x(n). To be exact, the digital filter executes the arithmetic operations in accordance with equations (17) and (18) presented below. These equations (17) and (18) are derived from equations (9) and (10) above by assuming that the number of taps N=4, provided the attenuated input data x(n) substitutes for the input data X(n).

$$Ya(n)=h(6)\cdot x(2n-6)+h(4)\cdot x(2n-4)+h(2)\cdot x(2n-2)+h(0)\cdot x(2n)-$$
$$h(7)\cdot x(2n-7)-h(5)\cdot x(2n-5)-h(3)\cdot x(2n-3)-h(1)\cdot x(2n-1) \quad (17)$$

$$Yb(n)=h(6)\cdot x(2n-6)+h(4)\cdot x(2n-4)+h(2)\cdot x(2n-2)+h(0)\cdot x(2n)+$$
$$h(7)\cdot x(2n-7)+h(5)\cdot x(2n-5)+h(3)\cdot x(2n-3)+h(1)\cdot x(2n-1) \quad (18)$$

Although FIG. 10 omits the writing of input data X(0) to X(7), it is assumed that the data X(0) to X(7) have been input prior to the input data X(8), each multiplied by the attenuation coefficient g(1) and stored into the RAM 141 as the attenuated input data x(0) to x(7). The first and second selectors 133 and 134 change over from one input to another, according to whether the input data X(0) to X(7) or the attenuated input data x(0) to x(7) is multiplied by respective appropriate coefficients.

The attenuated input data x(8) is first read from the RAM 131 via the first selector 133 and its corresponding filter coefficient h(0) is read from the ROM 132 via the second selector 134. The multiplier 135 multiplies the data x(8) by the filter coefficient h(0) and the multiplication product data is supplied to the accumulator 136. At this time, no data exists in the accumulator 136. Thus, the following value obtained by multiplying the attenuated input data x(8) by the filter coefficient h(0) is stored as is into the register 138:

$$A(1)=h(0)\cdot x(8)$$

Then, the input data x(6), x(4), and x(2) and their corresponding filter coefficients h(2), h(4), and h(6) are sequentially read from the RAM 131 and the ROM 132 respectively. The multiplier 135 multiplies X(6) by h(2), X(4) by h(4), and X(2) by h(6) and sequentially supplies each multiplication product data to the accumulator 44. Each multiplication product input is accumulated in the accumulator 135 and the following are sequentially stored into the register 138:

$$A(2)=h(2)\cdot x(6)+A1$$
$$A(3)=h(4)\cdot x(4)+A2$$
$$A(4)=h(6)\cdot x(2)+A3$$

Eventually, the following data is stored into the register 138:

$$A(4)=h(0)\cdot x(8)+h(2)\cdot x(6)+h(4)\cdot x(4)+h(6)\cdot x(2)$$

This data is stored into the first register 139.

Next, the attenuated input data x(7) is read from the RAM 131 via the first selector 133 and its corresponding filter coefficient h(1) is read from the ROM 132 via the second selector 134. The multiplier 135 multiplies the data x(7) by the filter coefficient h(1) and supplies the multiplication product data to the accumulator 136. At this time, the register 138 of the accumulator 136 is cleared to zero. Thus, the following value obtained by multiplying the attenuated input data x(7) by the filter coefficient h(1) is stored as is into the register 138:

$$B(1)=h(1)\cdot x(7)$$

Then, the attenuated input data x(5), x(3), and x(1) and their corresponding filter coefficients h(3), h(5), and h(7) are sequentially read from the RAM 131 and the ROM 132 respectively. Each product obtained by multiplying x(5) by h(3), x(3) by h(5), and x(1) by h(7) is sequentially supplied to the accumulator 136. Thus, the following are sequentially stored into the register 138:

$$B(2)=h(3)\cdot x(5)+B1$$
$$B(3)=h(5)\cdot x(3)+B2$$
$$B(4)=h(7)\cdot x(1)+B3$$

Eventually, the following data is stored into the register 138:

$$B(4)=h(1)\cdot x(7)+h(3)\cdot x(5)+h(5)\cdot x(3)+h(7)\cdot x(1)$$

This data is stored into the second register 140.

From the first register 139 and the second register 140, respectively, the data A(4) and B(4) are input to the adder-subtracter 141 where A(4) and B(4) are added and B(4) is subtracted from A(4). After it is processed by the adder-subtracter 141, the adding calculation data:

$$A(4)+B(4)=h(6)\cdot x(2)+h(4)\cdot x(4)+h(2)\cdot x(6)+h(0)\cdot x(8)+h(7)\cdot x(1)+$$
$$h(5)\cdot x(3)+h(3)\cdot x(5)+h(1)\cdot x(7)$$

is stored into the output register 142 as output data Yb(4). Also, the subtracting calculation data:

$$A(4)-B(4)=h(6)-x(2)+h(4)\cdot x(4)+h(2)\cdot x(6)+h(0)\cdot x(8)-h(7)\cdot x(1)-$$
$$h(5)\cdot x(3)-h(3)\cdot x(5)-h(1)\cdot x(7)$$

is stored into the output register 142 as output data Ya(4). As a result, the arithmetic operations expressed by equations (11) and (12) have now been completed.

Although, in this embodiment, the first selector 133 is defined to select either input data X(n) or attenuated input data x(n) and the second selector 134 is defined to select either an attenuation coefficient g(m) or a filter coefficient h(k), the data X(n) and attenuation coefficient g(m) inputs may be swapped.

[Fourth Embodiment]

Figure 11:
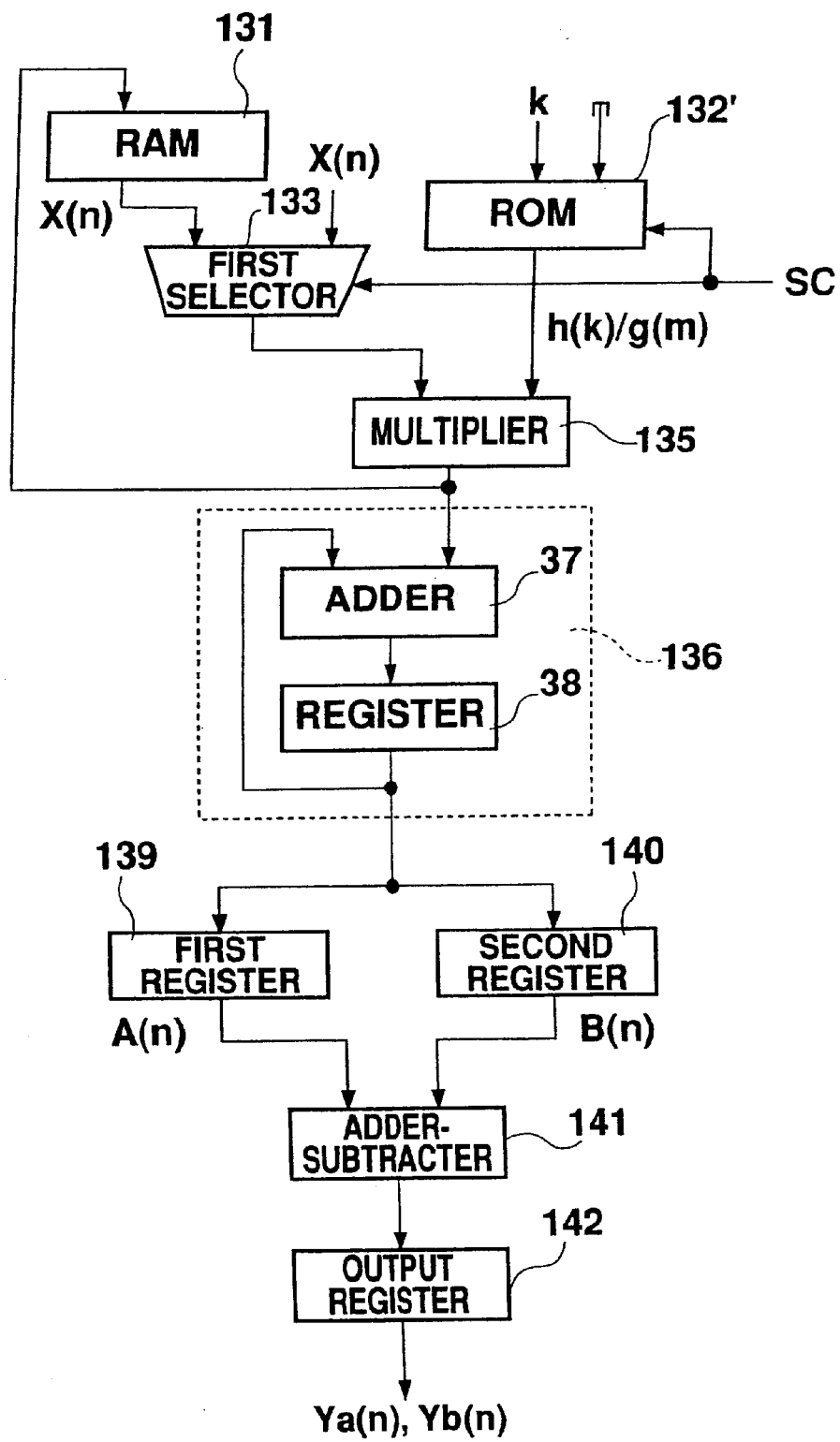
FIG. 11 is a block diagram showing a digital filter configured as in a fourth embodiment of the present invention.
Figure 12:
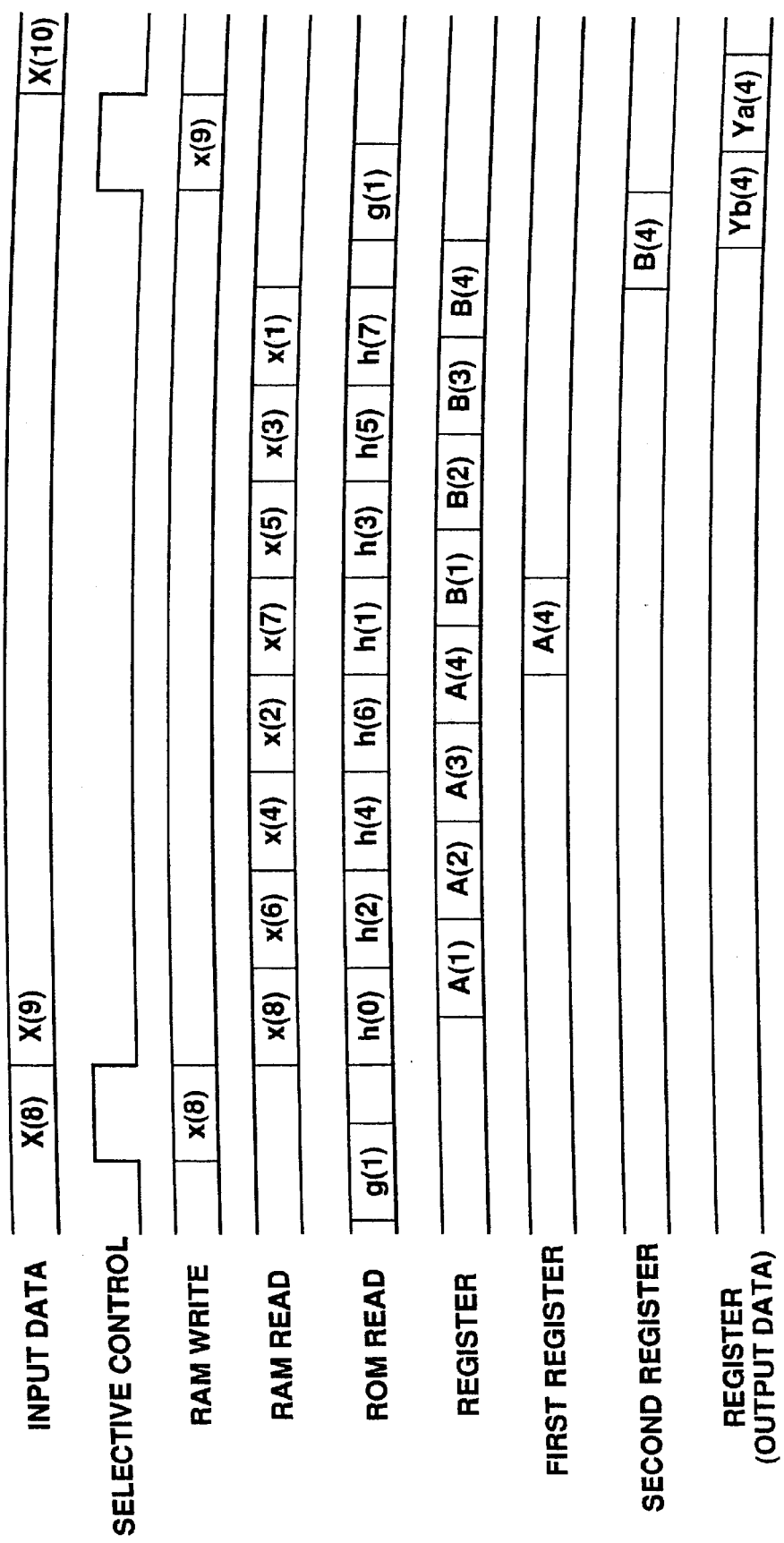
FIG. 12 is an internal data flow timing chart, intended to explain the operation of the digital filter of the fourth embodiment.

FIG. 11 is a block diagram showing a digital filter configured in accordance with a fourth embodiment of the present invention FIG. 12 is an internal data flow timing chart intended to explain the operation of such a digital filter. With the exception of ROM 132', the components shown in these Figs. are the same as those in FIG. 9, and their explanation will not be repeated.

ROM 132' stores an attenuation coefficient g(m) along with a plurality of filter coefficients h(k). In response to the selective control signal SC that controls the selective operation of a first selector 133, either an attenuation coefficient g(m) or a filter coefficient h(k) is read out from the ROM 132'. As shown in FIG. 12, when the first selector 133 selects input data X(n), an attenuation coefficient g(m) with a value of m specifying the degree of attenuation of the input data X(n) is read out from the ROM 132'. When the first selector 133 selects attenuated data x(n), a step-specific filter coefficient h(k) with a value of k incrementing step by step is read out from the ROM 132' repeatedly, where k corresponds to the k given in equations (9) and (10) above, as noted with reference to FIG. 9.

Therefore, the ROM 132' functions as if it were the second selector 134 shown in FIG. 9. That is, an attenuation coefficient g(m) is supplied from the ROM 132' to the multiplier 135 if another input to the multiplier is input data X(n) and a filter coefficient h(k) is supplied from the ROM 132' to the multiplier 135 if another input to the multiplier is attenuated input data x(n). As a result, the digital filter in the fourth embodiment can accomplish exactly the same operation as the digital filter embodiment shown in FIG. 9.

In the device according to this embodiment, a digital filter can be provided with the attenuation function without using an additional multiplier, making use of a QMF based on the stored program method. This is beneficial to reducing the size of the entire circuit.

[Fifth Embodiment]

Figure 13:
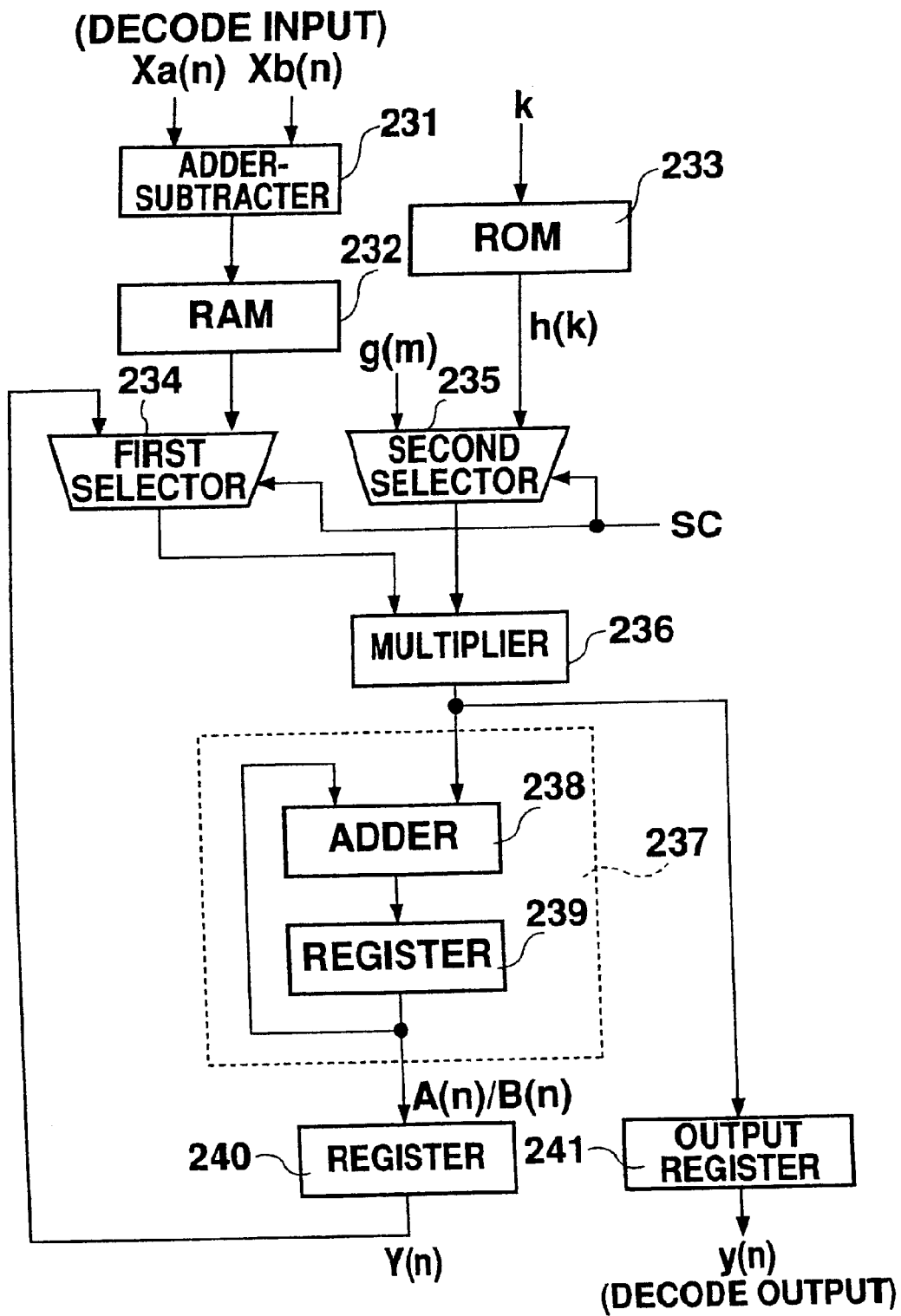
FIG. 13 is a block diagram showing a digital filter configured as in a fifth embodiment of the present invention.

FIG. 13 is a block diagram showing a digital filter configured in accordance with a fifth embodiment of the present invention.

An adder-subtracter 132, connected to the decode input, executes subtracting and adding calculations on the first time-series input data X(a) and the second time-series input data X(b). That is, the adder-subtracter 132 generates adding/subtracting calculation data {Xa(n)±Xb(n)} by subtracting the second input data Xb(n) from the first input data Xa(n) and adding the first input data Xa(n) and the second input data Xb(n). A RAM 232, connected to the adder-subtracter 132, stores the adding/subtracting calculation data {Xa(n)±Xb(n)} for a given period. The data stored in the RAM 232 is sequentially read out for each further arithmetic processing step. From a ROM 233, in which a plurality of filter coefficients h(k) have previously been stored, a step-specific filter coefficient h(k) with a value of k incrementing step by step is read out repeatedly, where k corresponds to the k in equations (9) and (10).

A first selector 234, connected to the RAM 232 and a register 240 which is explained below, selects and outputs either the adding/subtracting calculation data {Xa(n)±Xb(n)} read from the RAM 232 or the resultant data held by the register 240. A second selector 235, connected to the attenuation input and a ROM 233, selects and outputs either an attenuation coefficient g(m) or a filter coefficient h(k) read from the ROM 233. These first and second selectors 234 and 235 are placed under selective control in response to a common selective control signal SC.

A multiplier 236, connected to the first selector 234 and the second selector 235, multiplies either adding/subtracting calculation data {Xa(n)±Xb(n)} or resultant data Y(n) which has been selected by the first selector by either an attenuation coefficient g(m) or a filter coefficient h(k) which has been selected by the second selector 235. The selectors 234 and 235 are designed to operate as follows. When the first selector 234 selects the adding/subtracting calculation data {Xa(n)±Xb(n)}, the second selector 235 selects a filter coefficient h(k). When the first selector 234 selects resultant data Y(n), the second selector 235 selects an attenuation coefficient g(m). The multiplier 236 thus executes either the multiplication of adding/subtracting calculation data {Xa(n)±Xb(n)} by an filter coefficient h(k) or the multiplication of resultant data Y(n) by an attenuation coefficient g(m). The data produced by multiplying adding/subtracting calculation data {Xa(n)±Xb(n)} by an filter coefficient h(k) is supplied to an accumulator 237. The data produced by multiplying resultant data Y(n) by an attenuation coefficient g(m) is supplied to an output register 241.

The accumulator 237, consisting of an adder 238 and a register 239, is connected to the multiplier 236. The accumulator 237 accumulates each multiplication product data which has been input to it from the multiplier 236 in accordance with the number of taps. To be exact, the adder 238 adds the data read from the register 239 and the multiplication product data supplied from the multiplier 236 and the resultant sum is stored into the register 239 again. In this way, the product of each multiplication executed by the multiplier 236 is accumulated. A register 240, connected to the accumulator 237, stores the accumulation data received from the accumulator 237 and supplies this data to the first selector 234 as resultant data Y(n). The output register 241, connected to the multiplier 236, stores the data obtained by multiplying resultant data Y(n) by an attenuation coefficient g(m) and outputs data y(n). The output from this output register 241 is a decode output from the input data Xa(n) and Xb(n).

In the digital filter whose components are outlined above, the multiplier 236 multiplies the data by a filter coefficient h(k) and an attenuation coefficient g(m) on a time-sharing basis. The digital filter thus generates output data y(n) from the input data Xa(n) and Xb(n) through the processes of attenuation and separation of the input data. This digital filter enables the input data attenuation without adding a new multiplier.

Figure 14:
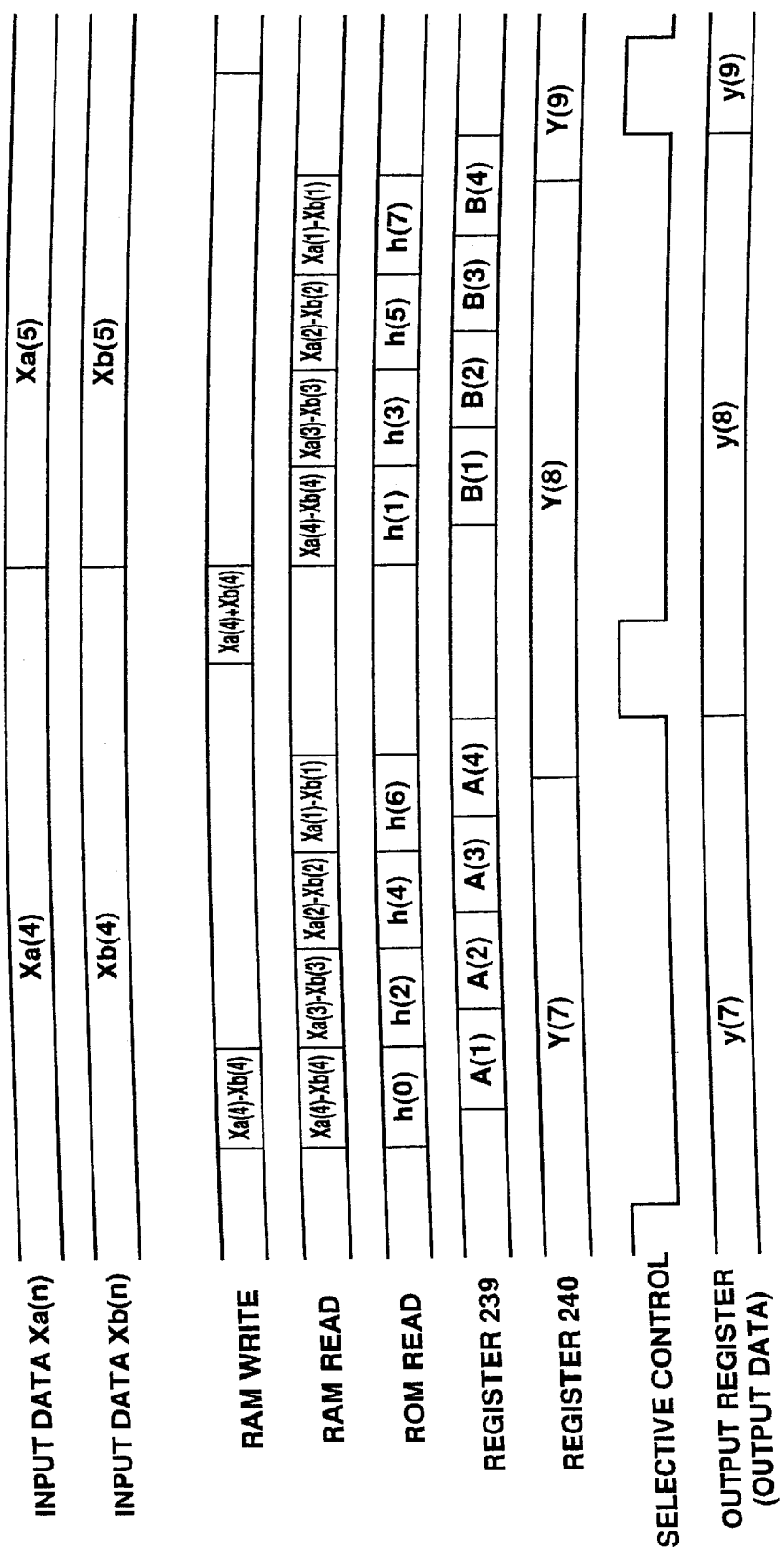
FIG. 14 is an internal data flow timing chart, intended to explain the operation of the digital filter of the fifth embodiment.

FIG. 14 shows an internal data flow timing chart explaining the synthesis filter operation of a digital filter configured as shown in FIG. 13, when the number of taps N is assumed to be 4, that is, n=4.

The digital filter executes the synthesis of the first and second time-series input data Xa(n) and Xb(n). To be exact, the digital filter executes the arithmetic operations in accordance with equations (15) and (16) which are obtained by calculating equations (9) and (10).

When input data Xa(4) and Xb(4) are input to the adder-subtracter 231, the input data Xb(4) is first subtracted from the input data Xa(4) and the subtracting calculation data {Xa(4)−Xb(4)} is written into the RAM 232. Although FIG. 14 omits the subtraction processing for input data Xa(1) to Xa(3) and Xb(1) to Xb(3), subtraction is executed in the same manner as done for the input data Xa(4) and Xb(4); i.e., the adder-subtracter 231 subtracts Xb(1) from Xa(1), Xb(2) from Xa(2), and Xb(3) from Xa(3). Then, it is assumed that the subtracting calculation data {Xa(1)−Xb(1)}, {Xa(2)−Xb(2)}, and {Xa(3)−Xb(3)} have also been stored into the RAM 132.

Initially, the first selector 234 selects the subtracting calculation data {Xa(n)−Xb(n)} and the second selector 235 selects a filter coefficient h(k). In this condition, when the subtracting calculation data {Xa(4)−Xb(4)} is read from the RAM 232 and its corresponding filter coefficient h(0) is read from the ROM 233, the multiplier 236 multiplies the data {Xa(4)−Xb(4)} by h(0) and supplies the multiplication product data to the accumulator 237. At this time, the register 239 or the accumulator 237 is cleared to zero. Thus, the following value obtained by multiplying the subtracting calculation data {Xa(4)−Xb(4)} by the filter coefficient h(0), is stored as is into the register 239:

$$A(1)=h(0)\cdot\{Xa(4)-Xb(4)\}$$

Then, the subtracting calculation data {Xa(3)−Xb(3)}, {Xa(2)−Xb(2)}, and {Xa(1)−Xb(1)} and their corresponding filter coefficients h(2), h(4), and h(6) are sequentially read from the RAM 232 and the ROM 233, respectively. The multiplier 236 multiplies {Xa(3)−Xb(3)} by h(2), {Xa(2)−Xb(2)} by h(4), {Xa(1)−Xb(1)} by h(6) and sequentially supplies each multiplication product data to the accumulator 237. Each multiplication product input is accumulated in the accumulator 237 and the following are sequentially stored into the register 239:

$$A(2)=h(2)\cdot\{Xa(3)-Xb(3)\}+A1$$

$$A(3)=h(4)\cdot\{Xa(2)-Xb(2)\}+A2$$

$$A(4)=h(6)\cdot\{Xa(1)-Xb(1)\}+A3$$

Eventually, the following data is stored into the register 239:

$$A(4)=h(0)\cdot\{Xa(4)-Xb(4)\}+h(2)\cdot\{Xa(3)-Xb(3)\}+h(4)\cdot\{Xa(2)-Xb(2)\}+h(6)\cdot\{Xa(1)-Xb(1)\}$$

This data is stored into the register 240 as resultant data Y(8). As a result, the arithmetic operation expressed by the above-mentioned equation (11) has now been accomplished.

When the multiplier 236 finishes multiplying the subtracting calculation data {data(1)–Xb(1)} by the filter coefficient h(6), the first selector 234 changes to receiving the resultant data Y(n) (the input from the register 240 ) and the second selector 235 changes to receiving an attenuation coefficient g(m). The resultant data Y(8) stored in the register 240 is input to the multiplier 236 via the first selector 234 and multiplied by an attenuation coefficient g(h) which has been input via the second selector 235. The multiplication product data g(1)·Y(8) is then stored into the output register 241 as output data y(8).

Next, the adder-subtracter 231 adds the first input data Xa(4) and the second input data Xb2(4) and the sum {Xa(4)+Xb(4) is written into the RAM 232. Although FIG. 14 omits the addition processing for input data Xa(1) to Xa(3) and Xb(1) to Xb(3), addition is executed in the same manner as done for the input data Xa(4) and Xb(4); i.e., the adder-subtracter 231 adds Xa(1) and Xb(1), Xa(2) and Xb(2), and Xa(3) and Xb(3). Then, it is assumed that the adding calculation data {Xa(1)+Xb(1)}, {Xa(2)+Xb(2)}, and {Xa(3)+Xb(3)} have also been stored into the RAM 232. When the adding calculation data is stored into the RAM 232, the first selector 234 returns to receiving adding calculation data Xa(n)+Xb(n)} (the input from the RAM 232 ) and the second selector returns to receiving a filter coefficient h(k) (the input from the ROM 233).

When the adding calculation data {Xa(4)+Xb(4)} is read from the RAM 232 and its corresponding filter coefficient h(1) is read from the ROM 233, the multiplier 236 multiplies the data {Xa(4)+Xb(4)} by h(1) and inputs the multiplication product data to the accumulator 237. At this time, no data exists in the accumulator 237. Thus, the following data obtained by multiplying the adding calculation data {Xa(4)+Xb(4)} by the filter coefficient h(1) is stared as is in the register 239.

$$B(1)=h(1)\cdot\{Xa(4)+Xb(4)\}$$

Next, the adding calculation data {Xa(3)+Xb(3)}, {Xa(2)+Xb(2)}, and {Xa(1)+Xb(1)} and the filter coefficients h(3), h(5), and h(7) are sequentially read from the RAM 232 and the ROM 233 respectively. Each product obtained by multiplying {Xa(3)+Xb(3)} by h(3), {Xa(2)+Xb(2)} by h(5), {Xa(1)+Xb(1)} by h(7) is sequentially supplied to the accumulator 237. Thus, the following are sequentially stored into the register 239:

$$B(2)=h(3)\cdot\{Xa(3)+Xb(3)\}+B1$$

$$B(3)=h(5)\cdot\{Xa(2)+Xb(2)\}+B2$$

$$B(4)=h(7)\cdot\{Xa(1)+Xb(1)\}+B3$$

Eventually, the following data is stored into the register 239:

$$B(4)=h(1)\cdot\{Xa(4)+Xb(4)\}+h(3)\cdot\{Xa(3)+Xb(3)\}+h(5)\cdot\{Xa(2)+Xb(2)\}+h(7)\cdot\{Xa(1)+Xb(1)\}$$

This data is stored into the register 240 as resultant data Y(9). The arithmetic operation expressed by equation (12) is then complete.

When the multiplier 236 finishes multiplying the adding calculation data {Xa(1)+Xb(1)} by the filter coefficient h(7), the first selector 234 changes to receiving resultant data Y(n) (the input from the register 240) and the second selector 235 changes to receiving an attenuation coefficient g(m). The resultant data Y(9) stored into the register 240 is input to the multiplier 236 via the first selector 234 and multiplied by an attenuation coefficient g(1) which has been input via the second selector 235. The multiplication product data g(1)·Y(9) is then stored into the output register 241 as output data y(9).

Although, in the above description, the first selector 234 is defined to select either adding/subtracting calculation data {Xa(n)±Xb(n)} or resultant data Y(n) and the second selector 235 is defined to select either a filter coefficient h(k) or an attenuation coefficient g(m), the resultant data Y(n) and attenuation coefficient g(m) inputs may be swapped when input to the selectors 234 and 235.

[Sixth Embodiment]

Figure 15:
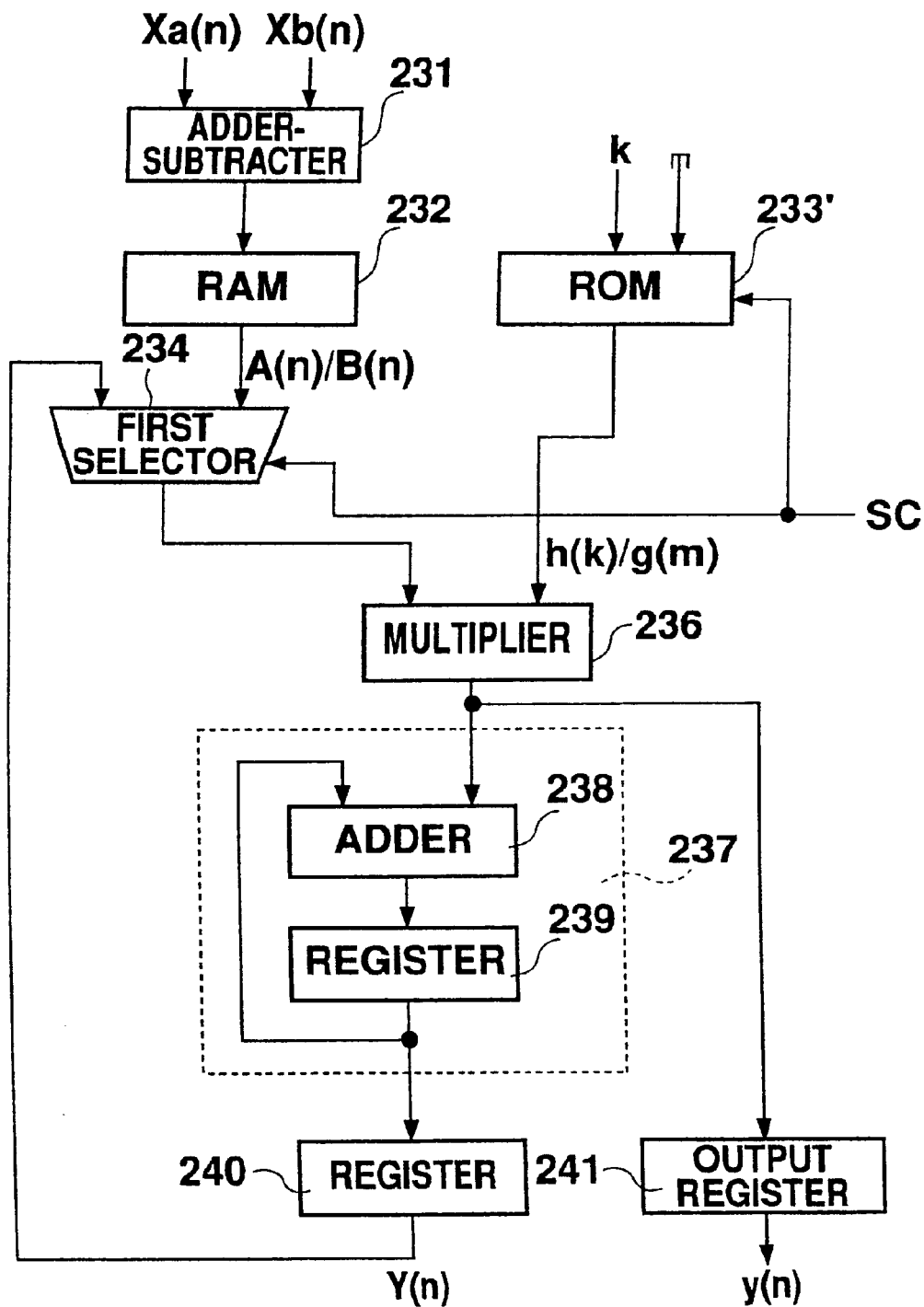
FIG. 15 is a block diagram showing a digital filter configured as in a sixth embodiment of the present invention.
Figure 16:
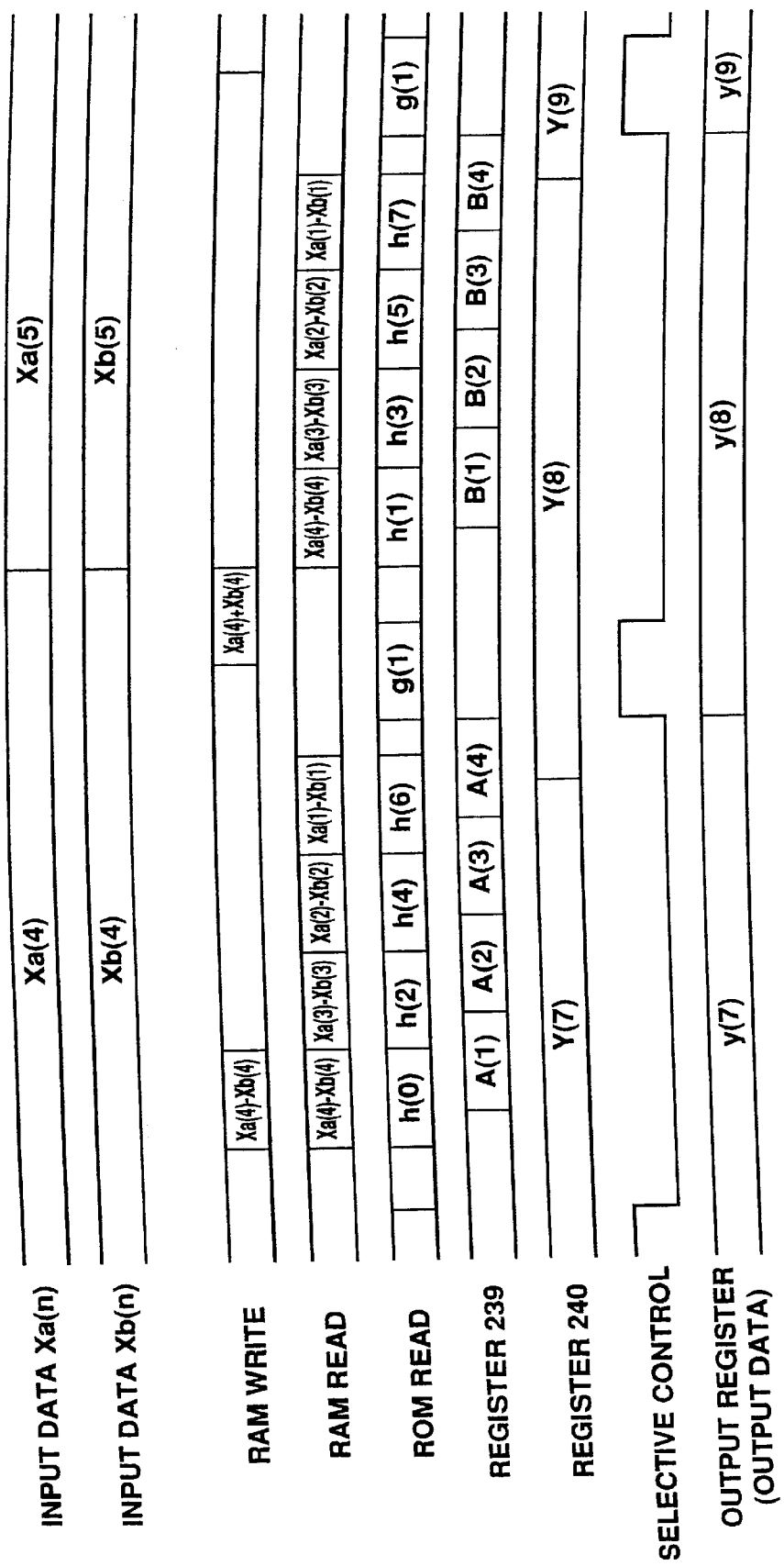
FIG. 16 is an internal data flow timing chart, intended to explain the operation of the digital filter of the sixth embodiment.

FIG. 15 is a block diagram showing a digital filter configured in accordance with a sixth embodiment of the present invention, with FIG. 16 being an internal data flow timing chart intended to explain the operation of such a digital filter. With the exception of ROM 233', the components shown in these Figs. are the same as those in FIG. 13, and their explanation will not be repeated.

A ROM 233' stores an attenuation coefficient g(m) along with plurality of filter coefficients h(k). In response to the selective control signal SC that controls the selective operation of a first selector 234, either an attenuation coefficient g(m) or a filter coefficient h(k) is read out from the ROM 233'. As shown in FIG. 16, when the first selector 234 selects adding/subtracting calculation data {Xa(n)±Xb(n)}, a step-specific filter coefficient h(k) with a value of k incrementing step by step is read out from the ROM 233' repeatedly, where k corresponds to the k given in the above-mentioned equations (9) and (10) as noted with reference to FIG. 13. When the first selector 234 selects resultant data Y(n), an attenuation coefficient g(m) with a value of m specifying the degree of attenuation of the resultant data Y(n) is read out from the ROM 233'.

Therefore, the ROM 233' functions as if it were the second selector 235 shown in FIG. 13. That is, a filter coefficient h(k) is supplied from the ROM 233' to the multiplier 236 if another input to the multiplier is adding/subtracting calculation data {Xa(n)±Xb(n)} and an attenuation coefficient g(m) is supplied from the ROM 233' to the multiplier 236 if another input to the multiplier is resultant data Y(n). As a result, a digital filter according to the sixth embodiment can accomplish exactly the same operation as the digital filter embodiment shown in FIG. 13.

In the digital filter configured as shown in FIG. 15, even if the concurrent inputs of two data Xa(n) and Xb(n) occur, the first register 48 can receive the input data Xa(n), while the second register 49 can receive the input data Xb(n) at the same time.

According to the present invention, a digital filter can be constructed mainly with a multiplier, an accumulator, and an adder-subtracter that are commonly used for its separation and synthesis filter functions, using a QMF based on the stored program method, beneficial for reducing its overall circuit size. Thus, further reduction of the overall size of the filter circuit size can be accomplished.

OTHER CONFIGURATIONS

It is also suitable to apply combinations of the above embodiments 1, 2, 3, 4, 5, and 6. For instance, the digital filter configurations according to the third and the fourth embodiments can be used instead of the separation filter functional block of the digital filter configured in accordance with the first and the second embodiments. This digital filter implementation method allows one multiplier to multiply the data by both an attenuation coefficient and a filter coefficient when the digital filter functions as the separation filter.

The digital filter configuration shown in FIG. 5 may be modified by adding the RAM 131, the first selector 133, and the second selector 134 shown in FIG. 9, for example. In this modification, an attenuation coefficient g(m) must have also been stored into the ROM 42 beforehand. Rearrangement should be made such that the output of the multiplier 43 shown in FIG. 5 will be input to the RAM 131. The first selector 133 should be located between the RAM 41 and the multiplier 43 and the second selector 134 between the ROM 42 and the multiplier 43. By thus reconfiguring the digital filter circuit shown in FIG. 5, the arithmetic for attenuation can be executed by using the multiplier 43.

Furthermore, the digital filter configurations according to the third and the fourth embodiments can be used instead of the synthesis filter functional block of the digital filter configured in accordance with the first and the second embodiments. This digital filter implementation method allows one multiplier to multiply the data by both an attenuation coefficient and a filter coefficient when the digital filter functions as the synthesis filter.

The digital filter configuration shown in FIG. 5 may be modified by adding the register 240, the first selector 234, and the second selector 235 shown in FIG. 13 to it, for example. In this modification, again, an attenuation coefficient g(m) must have also been stored into the ROM 42 beforehand. Rearrangement should be made such that the output of the register 46 shown in FIG. 5 will be imported to the register 240. The first selector 234 should be located between the RAM 42 and the multiplier 43 and the second selector 235 between the ROM 42 and the multiplier 43. By thus reconfiguring the digital filter circuit shown in FIG. 5, the arithmetic for attenuation can also be executed by using the multiplier 43.

What is claimed is:

1. A digital filter for producing data through input data synthesis, comprising:
   an adder-subtracter for adding or subtracting calculation on first and second time-series input data;
   a RAM for storing the adding/subtracting calculation data generated by said adder-subtracter;
   a selector to which adding/subtracting calculation data generated by said adder-subtracter and resultant data corresponding to each adding/subtracting calculation data are input together with a filter coefficient associated with said adding/subtracting calculation data and a given attenuation coefficient and which selects either a pair of said adding/subtracting calculation data and said filter coefficient or a pair of said resultant data and said attenuation coefficient;
   a multiplier for multiplying said adding/subtracting calculation data by said filter coefficient or said resultant data by said attenuation coefficient, according to the pair of data selected by said selector;
   an accumulator which sequentially accumulates the product of multiplication executed by said multiplier for the pair of said adding/subtracting calculation data and said filter coefficient; and
   a register which receives and stores the sum of accumulation executed by said accumulator and supplies it to said selector as said resultant data,
   said digital filter outputting the product of multiplication executed by said multiplier for the couple of said resultant data and said attenuation coefficient as output data produced by the synthesis of said first and second time-series input data.

2. The digital filter according to claim 1, further including:
   a ROM for storing a plurality of filter coefficients, one filter coefficient being read from it and supplied to said multiplier each time said multiplier is executing its arithmetic operation.

3. The digital filter according to claim 2, wherein said ROM stores a given attenuation coefficient along with said filter coefficients.

4. The digital filter according to claim 3, wherein reading of said ROM is controlled to determine whether a filter coefficient or an attenuation coefficient is supplied to said multiplier.

5. The digital filter according to claim 1, further including:
   an output register which stores the result of arithmetic executed by said adder-subtracter as the first and second time-series output data.

* * * * *

UNITED STATES PATENT AND TRADEMARK OFFICE
CERTIFICATE OF CORRECTION

PATENT NO.    : 6,360,240 B2
DATED         : March 19, 2002
INVENTOR(S)   : Takano et al.

It is certified that error appears in the above-identified patent and that said Letters Patent is hereby corrected as shown below:

Title page,
Item [75], Inventors, delete "Fumiaki Nagao".

Column 1,
Line 45, Formula (4), delete "e" and insert therefor -- $\theta$ --.

Column 4,
Line 6, (In formula #12), after "Xa(n-k)", delete "-" and insert therefor -- + --.

Column 5,
Line 28, before "an attenuation" delete "corporate" and insert therefor -- incorporate --.
Line 54, before "filter" delete "an" and insert therefor -- a --.

Column 8,
Line 8, after "(5)·X" delete "(25)" and insert therefor -- (2n-5) --.

Column 9,
Line 29, after "N=4" delete ". The" and insert -- , the --.
Line 52, after "substracts" delete "xb(1)" and insert therefor -- Xb(1) --.

Column 14,
Line 31, after "=h(6)" delete "-" and insert therefor -- • --.
Line 46, after "invention" insert therefor -- . --.
Line 56, after "ROM" delete "132" and insert therefor -- 132', --.
Line 57, before "As" delete " '. ".

Column 15,
Lines 54 and 57, after "by" delete "an" and insert therefor -- a --.

Column 17,
Line 10, after "calculation data" delete "{data" and insert therefor -- {Xa --.
Line 16, after "coeffficient" delete "g(h)" and insert therefor -- g(1) --.
Line 21, after "data" delete "xb2(4)" and insert therefor -- Xb(4) --.
Line 42, after "h(1) is" delete "stared" and insert therefor -- stored --.

UNITED STATES PATENT AND TRADEMARK OFFICE
CERTIFICATE OF CORRECTION

PATENT NO.    : 6,360,240 B2
DATED         : March 19, 2002
INVENTOR(S)   : Takano et al.

It is certified that error appears in the above-identified patent and that said Letters Patent is hereby corrected as shown below:

<u>Column 18,</u>
Line 26, after "with" insert therefor -- a --.

Signed and Sealed this

Twentieth Day of September, 2005

JON W. DUDAS
*Director of the United States Patent and Trademark Office*